United States Patent
Chowdhury et al.

(10) Patent No.: US 9,893,174 B2
(45) Date of Patent: Feb. 13, 2018

(54) III-NITRIDE BASED N POLAR VERTICAL TUNNEL TRANSISTOR

(71) Applicant: ARIZONA BOARD OF REGENTS ON BEHALF OF ARIZONA STATE UNIVERSITY, Scottsdale, AZ (US)

(72) Inventors: Srabanti Chowdhury, San Ramon, CA (US); Dong Ji, Tempe, AZ (US)

(73) Assignee: Arizona Board of Regents on Behalf of Arizona State University, Scottsdale, AZ (US)

(*) Notice: Subject to any disclaimer, the term of this patent is extended or adjusted under 35 U.S.C. 154(b) by 0 days.

(21) Appl. No.: 15/312,894

(22) PCT Filed: May 21, 2015

(86) PCT No.: PCT/US2015/032019
§ 371 (c)(1),
(2) Date: Nov. 21, 2016

(87) PCT Pub. No.: WO2015/179671
PCT Pub. Date: Nov. 26, 2015

(65) Prior Publication Data
US 2017/0229569 A1   Aug. 10, 2017

Related U.S. Application Data

(60) Provisional application No. 62/001,543, filed on May 21, 2014.

(51) Int. Cl.
*H01L 29/15* (2006.01)
*H01L 29/778* (2006.01)
(Continued)

(52) U.S. Cl.
CPC ...... *H01L 29/7787* (2013.01); *H01L 29/2003* (2013.01); *H01L 29/41741* (2013.01);
(Continued)

(58) Field of Classification Search
CPC ........... H01L 29/7787; H01L 29/66462; H01L 29/4236; H01L 29/7788; H01L 29/2003; H01L 29/41741
(Continued)

(56) References Cited

U.S. PATENT DOCUMENTS 7,488,651 B2   2/2009   Tang et al.
7,863,172 B2   1/2011   Zhu et al.
(Continued)

FOREIGN PATENT DOCUMENTS

JP   2013-172108   9/2012
WO   2005-079370   9/2005
(Continued)

OTHER PUBLICATIONS

Chowdhury, "Enhancement and Depletion Mode AlGaN/GaN CAVET With Mg-Ion-Implanted GaN as Current Blocking Layer", IEEE Electron Device Letters, vol. 29, No. 6, Jun. 2008.*
(Continued)

*Primary Examiner* — Vu A Vu
(74) *Attorney, Agent, or Firm* — Quarles & Brady LLP

(57) ABSTRACT

A semiconductor structure, device, or N-polar III-nitride vertical field effect transistor. The structure, device, or transistor includes a current blocking layer and an aperture region. The current blocking layer and aperture region are comprised of the same material. The current blocking layer and aperture region are formed by polarization engineering and not doping or implantation. A method of making a semiconductor structure, device, or III-nitride vertical transistor. The method includes obtaining, growing, or forming a functional bilayer comprising a barrier layer and a two-dimensional electron gas-containing layer. The functional bilayer is not formed via a regrowth step.

19 Claims, 22 Drawing Sheets

(51) Int. Cl.
  *H01L 29/20* (2006.01)
  *H01L 29/423* (2006.01)
  *H01L 29/66* (2006.01)
  *H01L 29/417* (2006.01)

(52) U.S. Cl.
  CPC .... *H01L 29/4236* (2013.01); *H01L 29/66462* (2013.01); *H01L 29/7788* (2013.01)

(58) Field of Classification Search
  USPC .......................................................... 257/76
  See application file for complete search history.

(56) References Cited

U.S. PATENT DOCUMENTS

| | | | |
|---|---|---|---|
| 7,915,643 B2 | 3/2011 | Suh et al. | |
| 8,183,572 B2* | 5/2012 | Kikkawa | H01L 29/0649 257/76 |
| 8,450,175 B2 | 5/2013 | Guha et al. | |
| 8,455,885 B2 | 6/2013 | Keller et al. | |
| 8,541,818 B2 | 9/2013 | Wu et al. | |
| 8,587,031 B2 | 11/2013 | Lu et al. | |
| 2009/0085065 A1* | 4/2009 | Mishra | H01L 21/187 257/194 |
| 2009/0267078 A1 | 10/2009 | Mishra et al. | |
| 2010/0264461 A1 | 10/2010 | Rajan et al. | |
| 2011/0068371 A1* | 3/2011 | Oka | H01L 29/66462 257/194 |
| 2012/0256189 A1 | 10/2012 | McDonald et al. | |
| 2012/0319127 A1* | 12/2012 | Chowdhury | H01L 29/66204 257/76 |
| 2013/0141156 A1 | 6/2013 | Teo et al. | |
| 2013/0181255 A1* | 7/2013 | Kiyama | H01L 29/66462 257/190 |

FOREIGN PATENT DOCUMENTS

| | | |
|---|---|---|
| WO | 2013020051 A1 | 2/2013 |
| WO | 2013-137957 | 9/2013 |

OTHER PUBLICATIONS

I Ben-Yaacov, "AlGaN / GaN Current Aperture Vertical Electron Transistors", PhD Thesis, University of California Santa Barbara, Mar. 2004, 152 pages.

S Chowdhury et al., "Current status and scope of gallium nitride-based vertical transistors for high-power electronics application", Semicond. Sci. Technol., 2013, 28:074014, 8 pages.

P Feng et al., "Design of Enhancement Mode Single-Gate and Double-Gate Multi-Channel Gan HEMT with Vertical Polarity Inversion Heterostructure", Mitsubishi Electric Research Laboratories Technical Report TR2013-036, May 2013, 6 pages.

M Moradi et al., "Vertical Transistor with Ultrathin Silicon Nitride Gate Dielectric", Adv. Mater., 21, pp. 4505-4510, 2009.

S Heikman, "MOCVD Growth Technologies for Applications in AlGaN/GaN High Electron Mobility Transistors", PhD Thesis, University of California Santa Barbara, Sep. 2002, 203 pages.

The Internet Search Report and Written Opinion dated Aug. 31, 2015 for International Application No. PCT/US2015/032019.

* cited by examiner

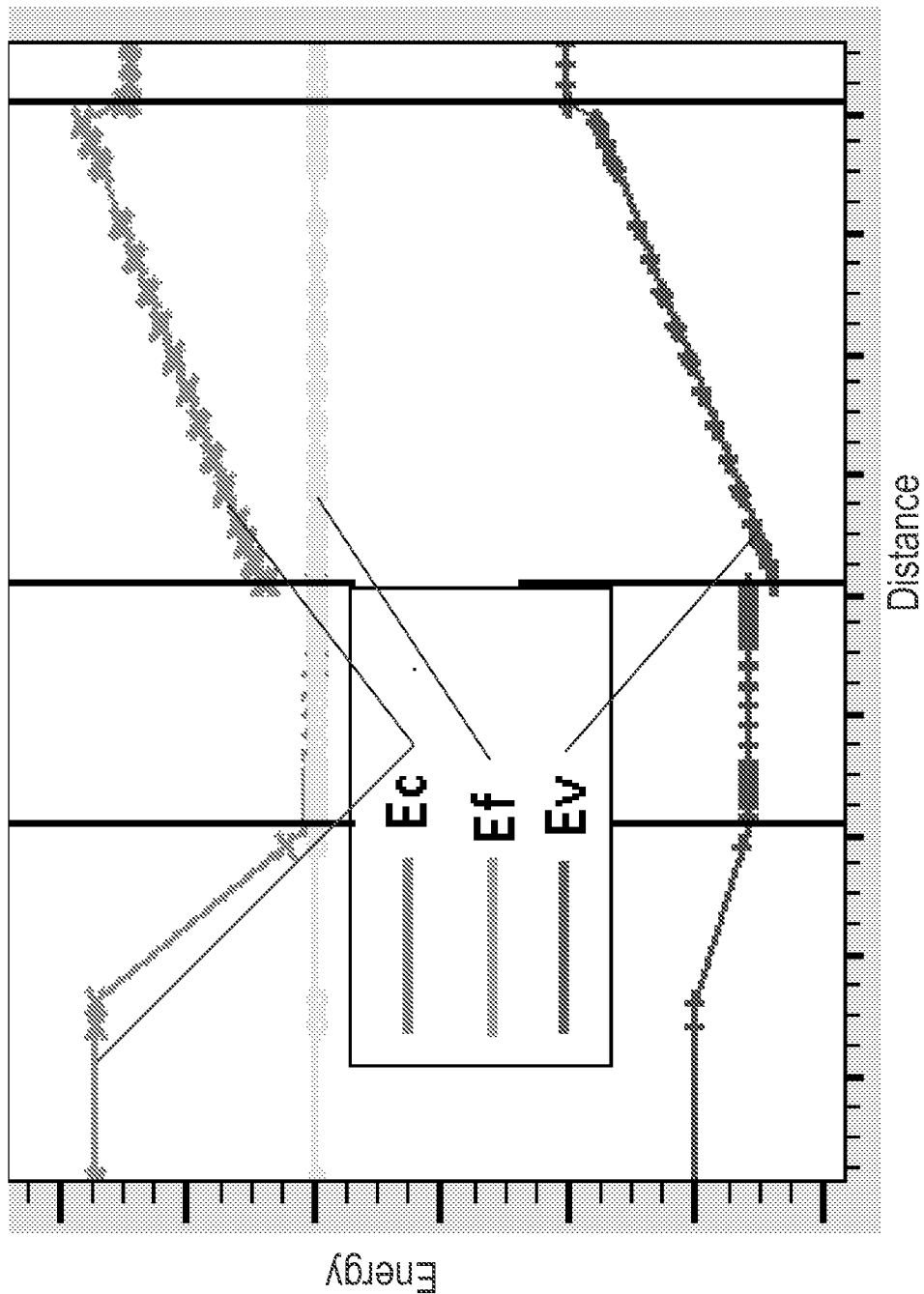

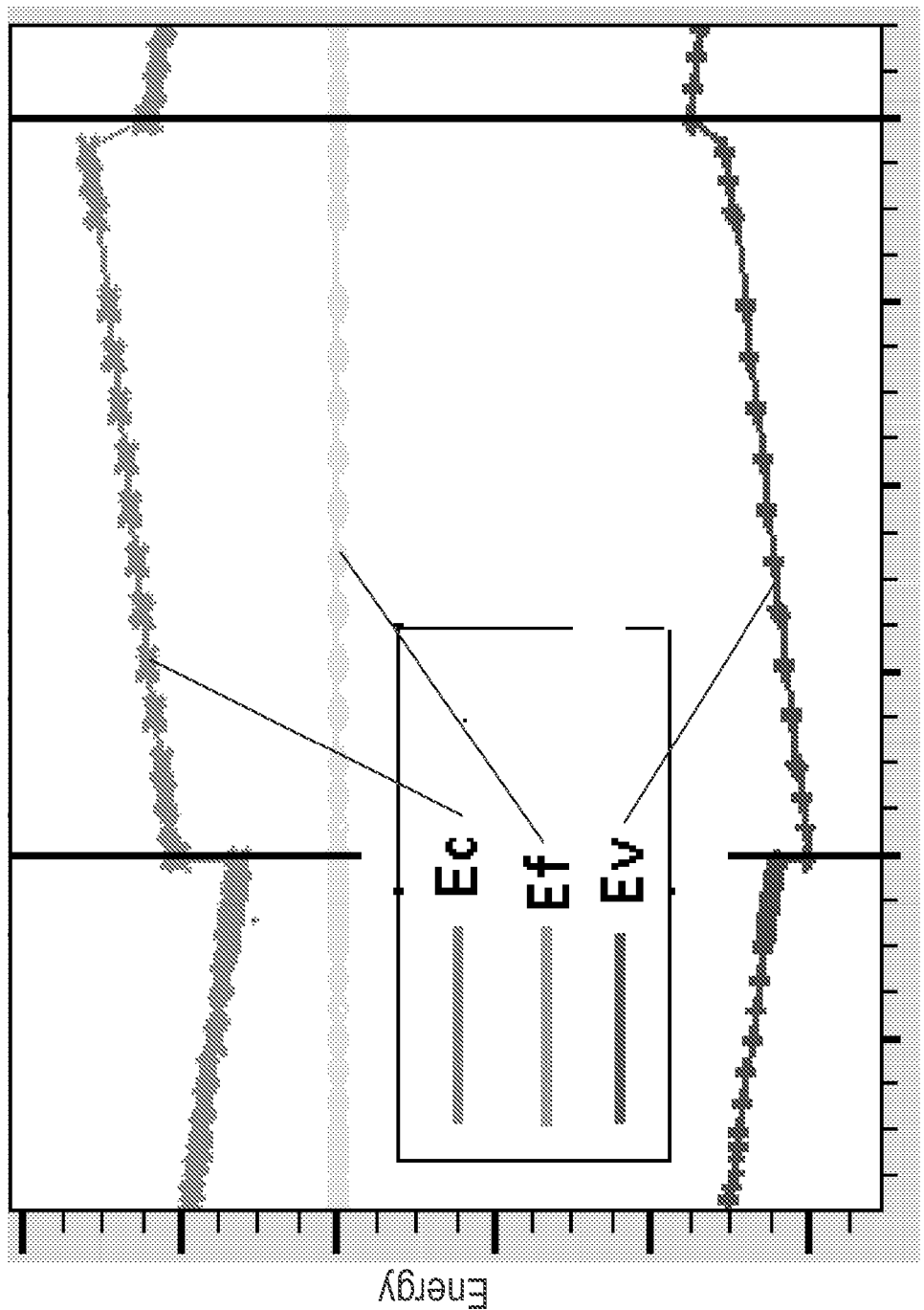

III-NITRIDE BASED N POLAR VERTICAL TUNNEL TRANSISTOR

CROSS-REFERENCE TO RELATED APPLICATIONS

This application represents the national stage entry of PCT International Application No. PCT/US2015/032019 filed on May 21, 2015 and claims the benefit of U.S. Provisional Patent Application No. 62/001,543 filed May 21, 2014, entitled "III-Nitride Based N Polar Vertical Tunnel Transistor", which is incorporated herein by reference for all purposes.

STATEMENT REGARDING FEDERALLY SPONSORED RESEARCH

N/A

BACKGROUND OF THE INVENTION

The disclosure relates generally to the field of electronic devices. More particularly, the disclosure relates to methods and systems directed to a vertical N-polar III-nitride based transistor.

Gallium nitride (GaN) is becoming the material of choice for power electronics to enable the roadmap of increasing power density by simultaneously enabling high-power conversion efficiency and reduced form factor. This is because the low switching losses of GaN enable high-frequency operation which reduces bulky passive components with negligible change in efficiency. Commercialization of GaN-on-Si materials for power electronics has led to the entry of GaN devices into the medium-power market since the performance-over-cost of even first-generation products looks very attractive compared to today's mature Si-based solutions. On the other hand, the high-power market still remains unaddressed by lateral GaN devices. The current and voltage demand for high-power conversion application makes the chip area in a lateral topology so large that it becomes difficult to manufacture. Vertical GaN devices would play a big role alongside silicon carbide (SiC) to address the high-power conversion needs.

Power conversion is ubiquitous in our everyday lives. It plays a role from charging our cell phone to powering our home. Power conversion could mean stepping up or stepping down from one voltage level to another (boost or buck) or a conversion from dc to an ac voltage (inverter) or from 1-phase to 3-phase (phase converter), or just isolating from the supply line (power factor correction). A switch can be regarded as the heart of any power conversion unit. An ideal switch is one which offers an infinite resistance to current in its OFF-state and zero resistance when in its ON-state. In solid state power electronics application a switch is realized by a transistor in its class D or higher operation. With advancement in solid state technologies the whole range of power electronics application can be addressed by solid state devices. According to a 2012 Presentation by Yole Development at CS-Europe (hosted by Compound Semiconductor), the range of power applications that can be addressed with GaN is shown in FIG. 1.

Si transistors have been providing the solutions for the entire range of voltages needed for power conversion ranging from 100 s of Watts to Megawatts with various devices like MOSFETs, IGBTs, SJTs, BJTs and thyristors. However the advent of wide bandgap (WBG) materials, and their rapid technological progress, promises enhanced performance beyond the Si roadmap. The higher critical electric field ($E_c$) due to the large bandgap of these materials makes them ideal for high-power electronics applications. Increasing operating voltages need higher $V_{bd}$ and higher efficiencies need lower $R_{ON}$ which is simultaneously best served by WBG materials.

GaN devices can be configured in a lateral or vertical configuration. In a typical lateral device, a thin layer of AlGaN is grown on top of the GaN channel to take advantage of the high mobility (~2000 cm$^2$ V$^{-1}$ s$^{-1}$) two-dimensional electron gas (2 DEG) formed at the AlGaN/GaN interface, which is used as the current carrying layer. The source, drain, and gate are fabricated on the same plane on the top of the typical lateral device. Electrons are modulated by the gate and flow from the source to the drain, where source-drain distance is primarily responsible for the blocking voltage in the off-state. However, for higher power (>10 kW) applications where higher breakdown voltages (>1.2 kV) are required, the lateral topology becomes increasingly unattractive both in cost and manufacturability due to the very large chip areas required by the breakdown voltages at the required current level (typically over 20 A).

Vertical topologies become more economical and viable for such a range of high power applications. A typical vertical device has a source and gate on the top and the drain on the bottom. One common example is a current aperture vertical electron transistor (CAVET). The current is controlled by the gate and the current flows through the bulk of the material into the drain. The horizontal high-mobility electron channel achieved by the AlGaN/GaN layer is used in conjunction with a thick GaN drift region in order to achieve low $R_{ON}$ and a high breakdown voltage. Current blocking layers (CBL) are achieved by either p-type doping of the GaN layer or by implantation of a material like Mg or Al. In both cases, the devices require an aperture through which the current will flow. In existing technology, the CBLs are thus fashioned by applying a mask in the shape of the aperture, implanting the CBLs in the regions not covered by the mask, and regrowing the remainder of the GaN device. However, this regrowth process involves an interruption of a single crystal growth, which tends to produce imperfections at an interface where regrowth is performed. Alternatively doped (p-type) CBL can be formed by growth or regrowth. Let us call the structure prior to regrowth as the "Base structure" and the regrown structure as the "Regrown structure". If the CBL, formed by doping, is a part of the base structure then the CBL in the aperture region needs to be etched and then the aperture region needs to be regrown in order to complete the device structure. If the aperture region is realized in the base structure then the CBL region is achieved by first etching the aperture layer in the designated CBL region and regrowing the CBL region with suitable doping. In either method regrowth is essential to fully fabricate the device.

The majority of GaN devices are produced with materials grown with Ga-polarity in the c-plane. Accordingly, the majority of current GaN device designs cannot achieve functions that are achievable by material properties that require materials grown with N-polarity.

Consequently, considering such limitations of previous technological approaches, it would be desirable to have a system and method for a producing a III-nitride vertical transistor with the above-mentioned functionality, but produced without a regrowth step.

SUMMARY OF THE INVENTION

The present disclosure overcomes the aforementioned drawbacks by presenting semiconductor structures, devices, and III-nitride vertical transistors, and methods of making and using the same.

In accordance with the present disclosure, a semiconductor device can include a current blocking layer and aperture region. The current blocking layer and aperture region may be comprised of the same material. The current blocking layer and aperture region may be formed by polarization engineering and not doping or implantation. The semiconductor device can further include a drain; a barrier layer disposed in a first direction relative to the drain and in electronic communication with the drain, the barrier layer comprising the current blocking layer and the aperture region; a two-dimensional electron gas-containing layer disposed in the first direction relative to the barrier layer; a gate electrode oriented to alter the energy levels of the aperture region when a gate voltage is applied to the gate electrode; and a source in ohmic contact with the two-dimensional electron gas-containing layer.

In accordance with the present disclosure, a method of making a semiconductor device can include obtaining, growing, or forming a N-polar GaN substrate comprising a functional bilayer comprising a barrier layer and a two-dimensional electron gas-containing layer disposed in a first direction relative to the barrier layer, the barrier layer formed without a regrowth step. The method can further include one or more of the following steps: removing a portion of the functional bilayer to form a gate region; depositing a dielectric material in the gate region and atop the two-dimensional electron gas-containing layer in the first direction relative to the two-dimensional electron gas-containing layer; removing two portions of the dielectric material atop the two-dimensional electron gas-containing layer to form source regions; forming source electrodes in ohmic contact with the two-dimensional electron gas-containing layer in the source regions; forming a gate electrode atop the dielectric material in the gate region; and forming a drain disposed in a second direction opposite the first direction relative to the functional bilayer.

In accordance with the present disclosure, a method of making a semiconductor device can include one or more of the following steps: obtaining, growing, or forming a N-polar GaN substrate comprising functional bilayer comprising a barrier layer and a two-dimensional electron gas-containing layer disposed in a first direction relative to the barrier layer, the functional bilayer formed without a regrowth step; forming a source electrode in ohmic contact with the two-dimensional electron gas-containing layer; forming a gate electrode oriented to provide alter the energy levels of the barrier layer to form an aperture region when a gate voltage is applied exceeding a threshold voltage; and forming a drain disposed in a second direction relative to the barrier layer, the second direction opposite the first direction.

The foregoing and other aspects and advantages of the disclosure will appear from the following description. In the description, reference is made to the accompanying drawings which form a part hereof, and in which there is shown by way of illustration a preferred embodiment of the disclosure. Such embodiment does not necessarily represent the full scope of the disclosure, however, and reference is made therefore to the claims and herein for interpreting the scope of the disclosure.

BRIEF DESCRIPTION OF THE DRAWINGS

FIG. 7a shows energy band diagrams of route 1 for the vertical transistor shown in FIG. 6a with a gate bias of 0 V.

FIG. 7b shows an energy band diagram of route 2 for the vertical transistor shown in FIG. 6a with a gate bias of 0 V.

DETAILED DESCRIPTION OF THE INVENTION

Before the present invention is described in further detail, it is to be understood that the invention is not limited to the particular embodiments described. It is also to be understood that the terminology used herein is for the purpose of describing particular embodiments only, and is not intended to be limiting. The scope of the present invention will be limited only by the claims.

As used herein, the singular forms "a", "an", and "the" include plural embodiments unless the context clearly dictates otherwise.

Specific structures, devices, transistors, and methods relating to III-nitride vertical transistors have been disclosed. It should be apparent to those skilled in the art that many additional modifications beside those already described are possible without departing from the inventive concepts. In interpreting this disclosure, all terms should be interpreted in the broadest possible manner consistent with the context. Variations of the term "comprising" should be interpreted as referring to elements, components, or steps in a non-exclusive manner, so the referenced elements, components, or steps may be combined with other elements, components, or steps that are not expressly referenced. Embodiments referenced as "comprising" certain elements are also contemplated as "consisting essentially of" and "consisting of" those elements.

The terms "(AlInGaN)" "(In,Al)GaN", or "GaN" as used herein (as well as the terms "μl-nitride," "Group-III nitride", or "nitride," used generally) refer to any alloy composition of the (Ga,Al,In,B)N semiconductors having the formula $Ga_wAl_xIn_yB_zN$ where $0 \leq w \leq 1$, $0 \leq x \leq 1$, $0 \leq y \leq 1$, $0 \leq z \leq 1$, and $w+x+y+z=1$. These terms are intended to be broadly construed to include respective nitrides of the single species, Ga, Al, In and B, as well as binary, ternary and quaternary compositions of such Group III metal species. Accordingly, it will be appreciated that the discussion of the disclosure hereinafter in reference to GaN and AlGaN materials is applicable to the formation of various other (Ga,Al,In,B)N material species. Further, (Ga,Al,In,B)N materials within the scope of the disclosure may further include minor quantities of dopants and/or other impurity or inclusional materials, unless otherwise explicitly stated.

This disclosure provides semiconductor structures, devices, III-nitride vertical transistors, and methods of making and using the same.

Figure 1:
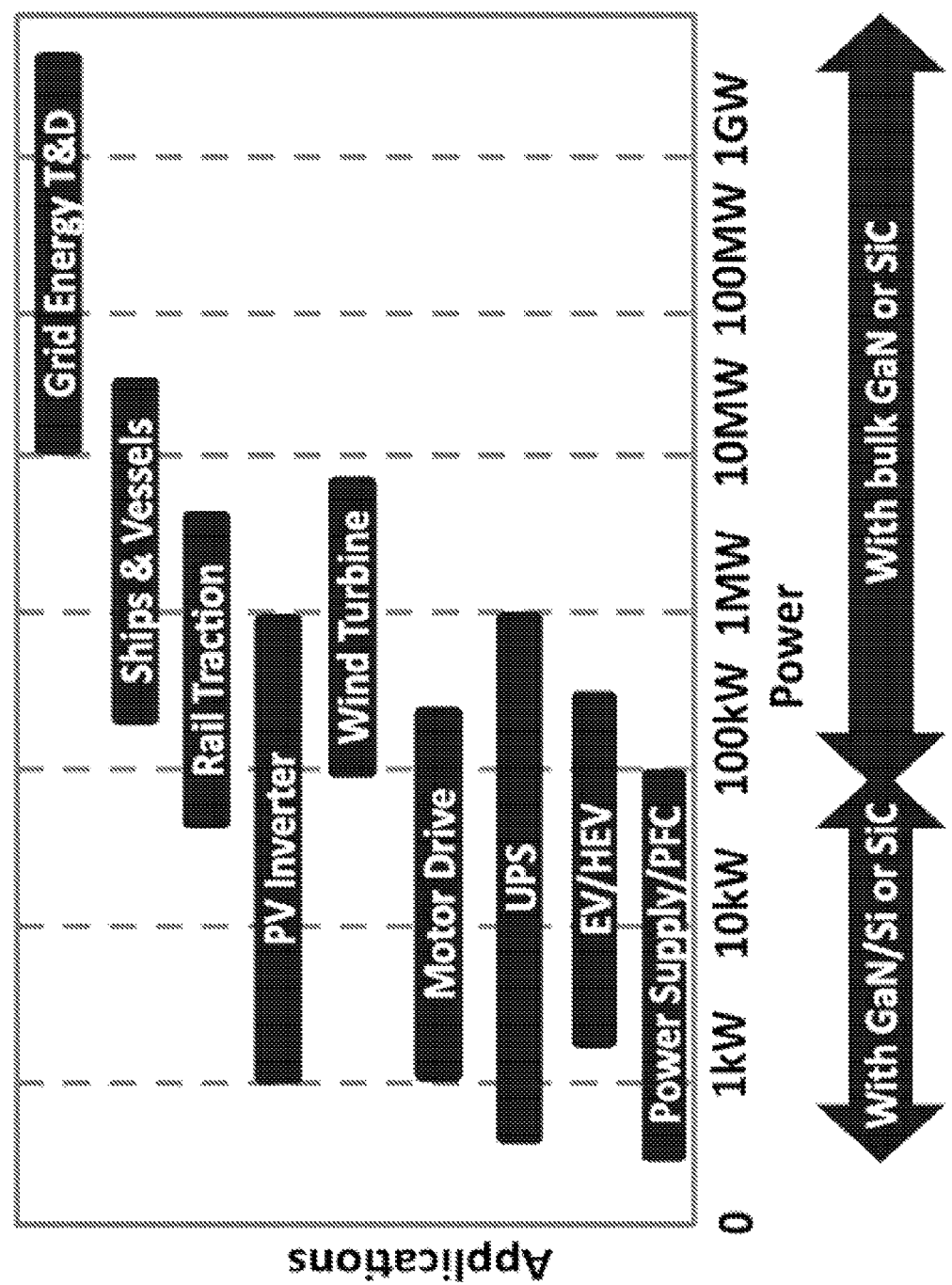
FIG. 1 is a graph showing the range of power applications that can be addressed with GaN.
Figure 2:
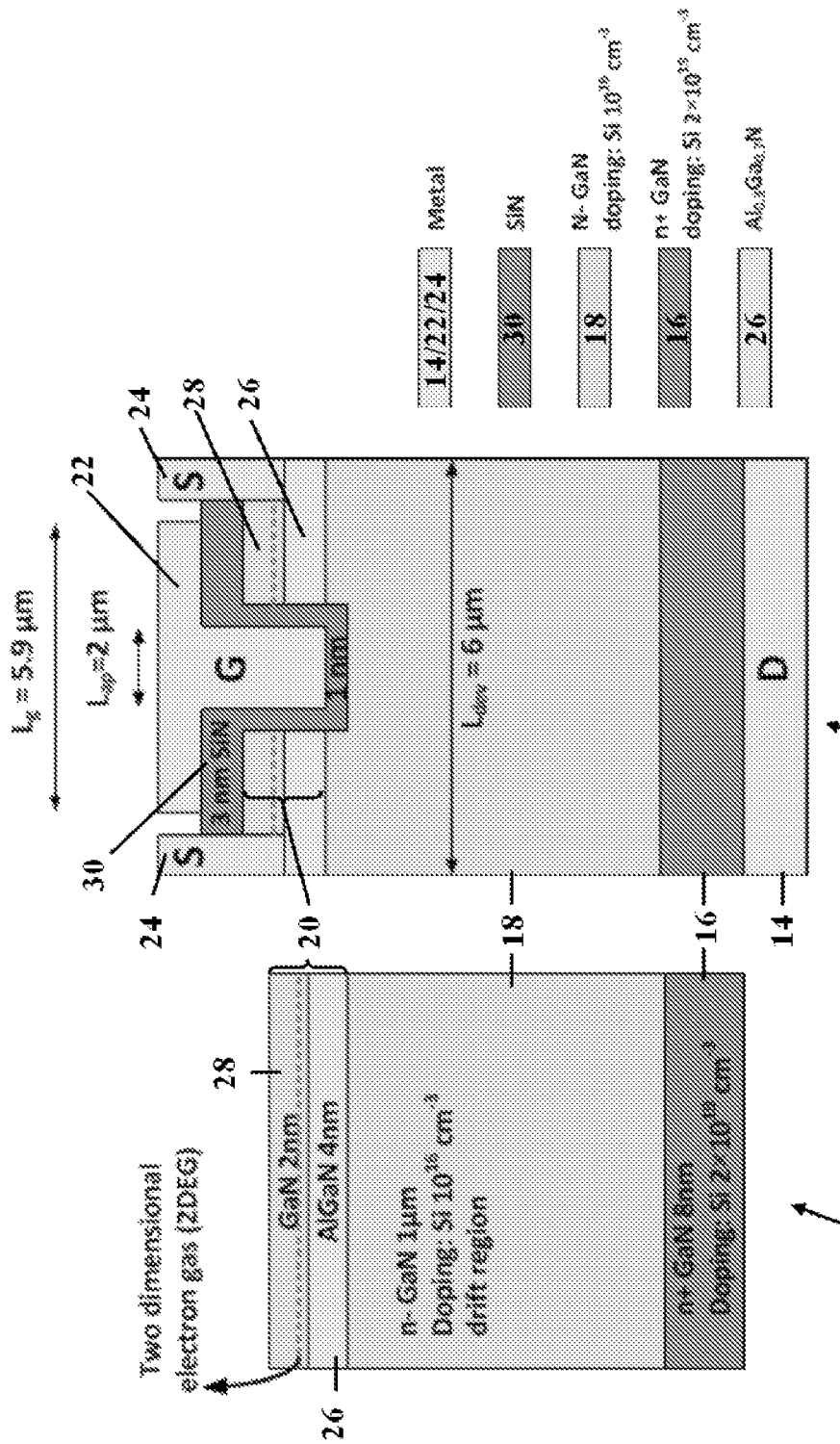
FIG. 2 is a schematic of the semiconductor structure (left) and III-nitride vertical transistor (right) of Example 1.

Referring to FIG. 2, in certain aspects, the semiconductor structure 10, device 12, or III-nitride vertical transistor 12 of the present disclosure may comprise one or more of the following: a drain 14; a substrate (not shown in FIG. 2); a current spreading layer 16; a drift layer 18; a functional bilayer 20, a gate 22, and a source 24.

Figure 10:
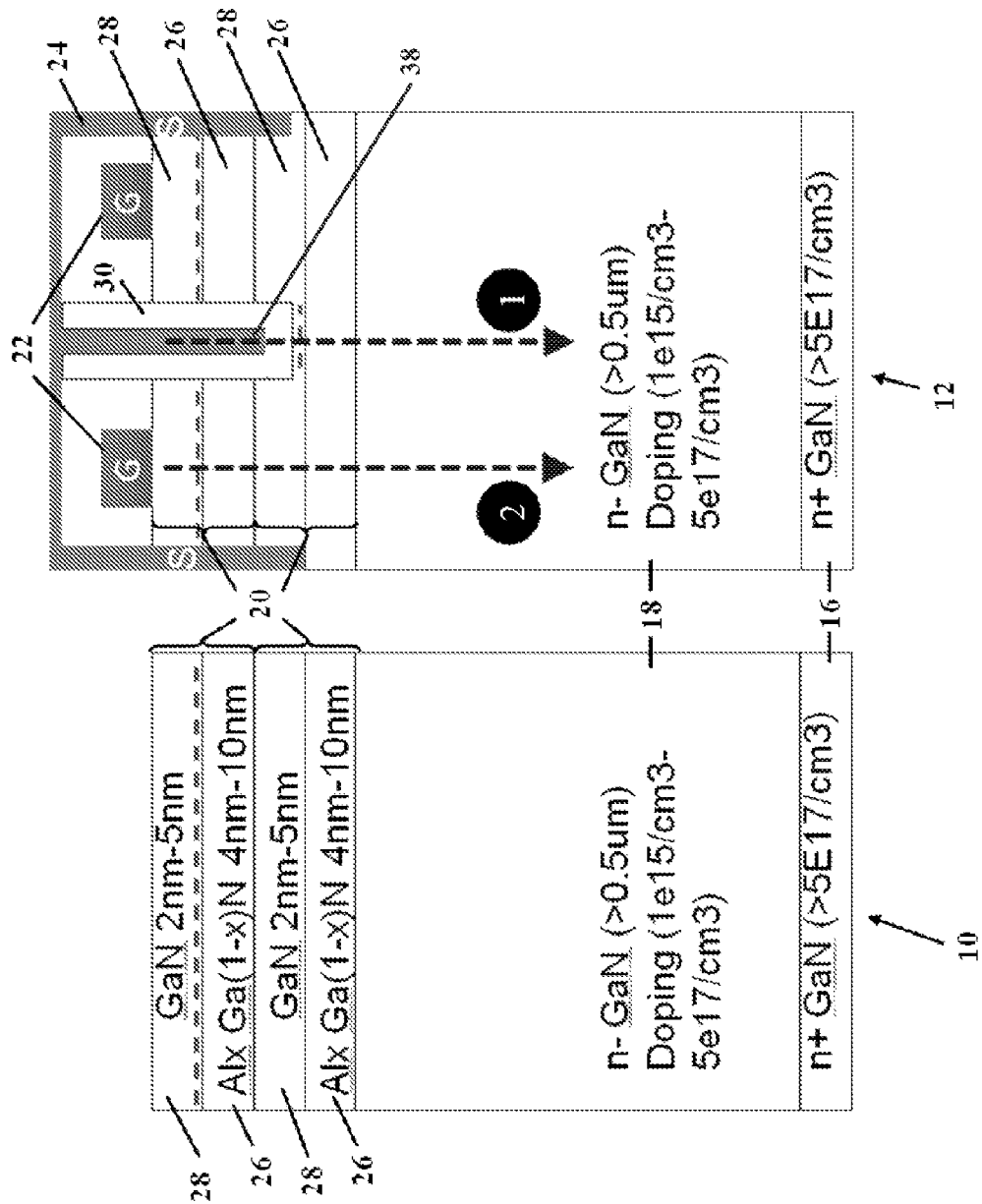
FIG. 10 is a schematic of the semiconductor structure (left) and III-nitride vertical transistor (right) of Example 2. Two cross-sections are represented by numerals 1 and 2.

The device 12 or III-nitride vertical transistor 12 may further comprise a source connected field plate (SCFP). The SCFP may provide an electronic environment that enables a 2 DEG to be formed at an appropriate place within the device 12 or transistor 12. Referring to FIG. 10, one non-limiting example of a SCFP 38 is shown.

Figure 3:
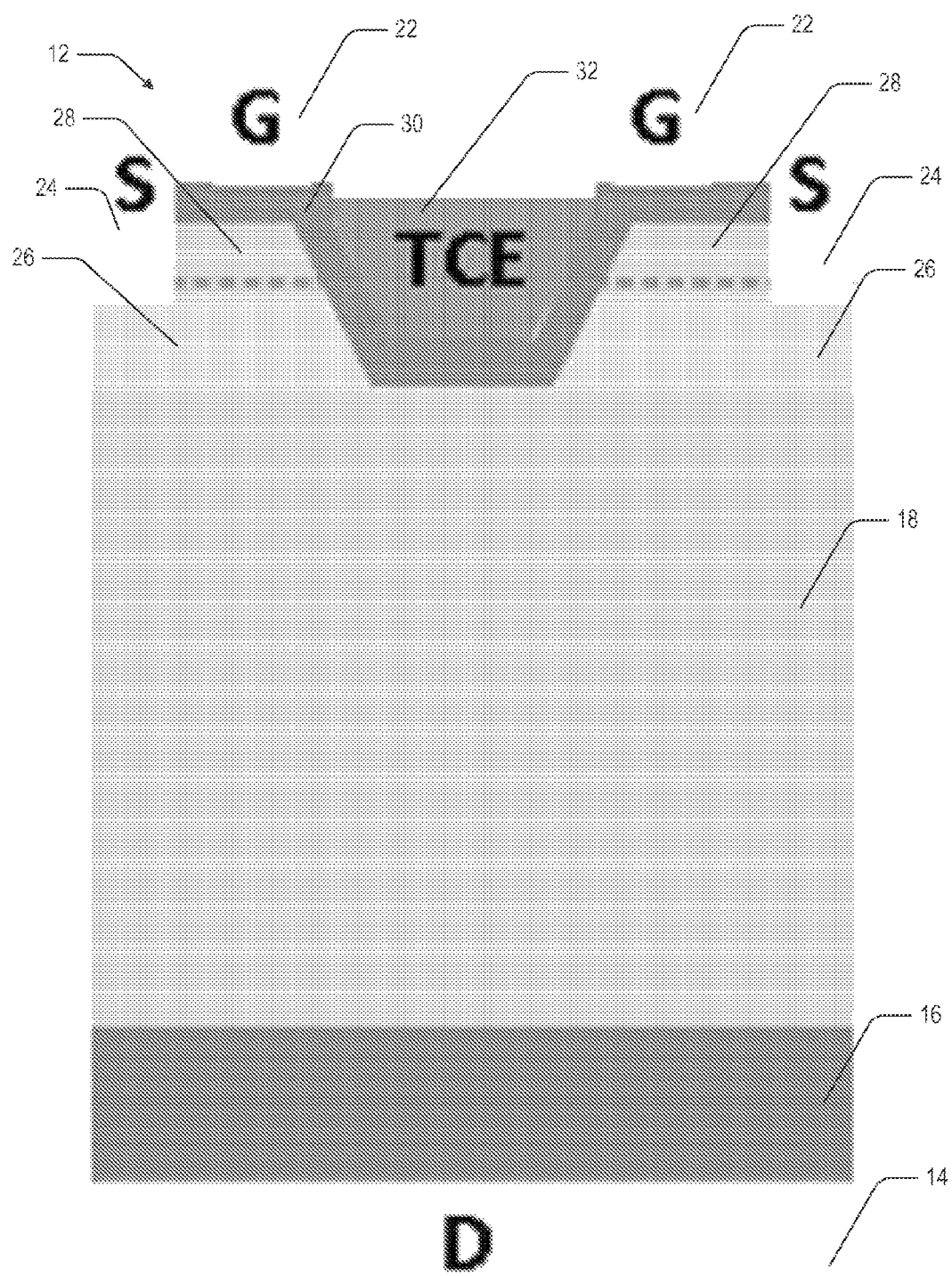
FIG. 3 is a schematic of a vertical transistor having a tunneling control electrode (TCE) according to one aspect of the disclosure.
Figure 4:
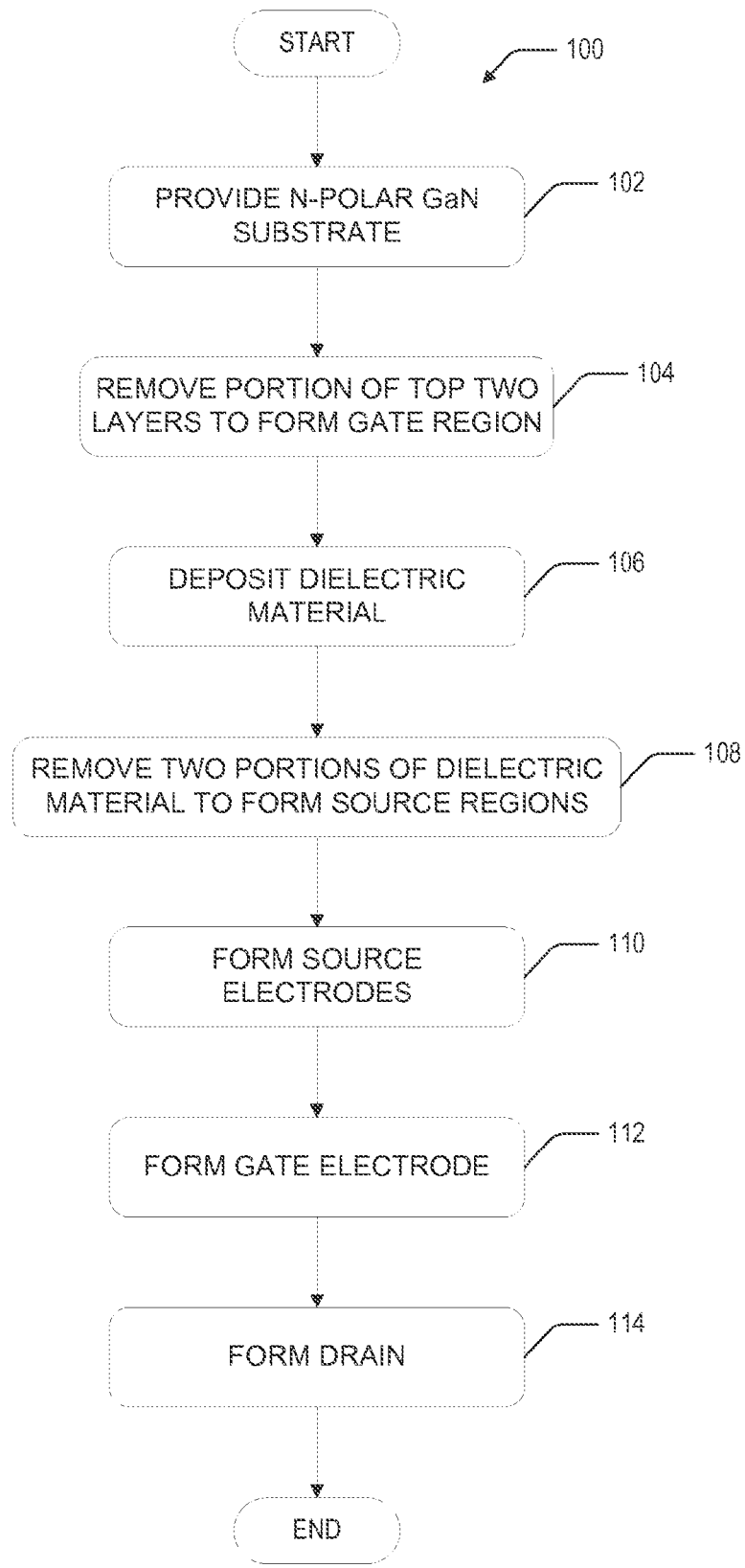
FIG. 4 is a flowchart showing a method in accordance with one aspect of the present disclosure.

The device 12 or III-nitride vertical transistor 12 may further comprise a tunneling control electrode (TCE) 32. The TCE 32 can be used to control tunneling by manipulating the energy bands of surrounding materials or layers. An aspect of the device 12 or III-nitride vertical transistor 12 of the disclosure having a TCE 32 is shown in FIG. 3, with the device 12 or transistor 12 having the same underlying semiconductor structure as shown in FIG. 2.

A drain 14 may serve as the base of the semiconductor structure 10, device 12, or III-nitride vertical transistor 12 of the present disclosure. The drain 14 is the target for the flow of electrons through the device 12 or III-nitride vertical transistor 12. A drain 14 may comprise a drain material. In principle, any material that functions suitably as a drain and allows growth of a layer coupled to and disposed adjacent to the drain in the vertical direction may be used with the present disclosure.

In certain aspects, the drain 14 may have a thickness ranging from about 1 nm to about 2.0 mm.

A substrate may be coupled to the drain 14 and disposed adjacent to the drain 14 in the vertical direction. Alternatively, the drain 14 may be coupled to the substrate and disposed adjacent to the substrate in the vertical direction. In certain aspects, a single material serves as both the drain 14 and the substrate.

A substrate may comprise a substrate material. Examples of suitable substrate materials include, but are not limited to, GaN, (Al,In,Ga)N, sapphire, silicon, silicon carbide, glass, polymers, metal, quartz, diamond, and the like.

In certain aspects, the substrate may have a thickness ranging from about 1 nm to about 2.0 mm. In aspects where the substrate is on the thin end of the aforementioned range, the substrate may be bonded to a carrier wafer. Without wishing to be bound by any particular theory, it is believed that substrates thicker than about 150 μm do not require bonding to a carrier wafer.

A current spreading layer 16 may be coupled to the drain 14 or the substrate and disposed adjacent to the respective drain 14 or substrate in the vertical direction.

The current spreading layer 16 may comprise a current spreading material. Examples of suitable current spreading material include, but are not limited to, n+ GaN, (Al,In,Ga)N, and the like.

In certain aspects, the current spreading layer 16 may have a thickness ranging from about 1 nm to about 2 mm.

The current spreading material may comprise a current spreading dopant. In certain aspects, the current spreading dopant may comprise silicon, oxygen, germanium, and the like. In certain aspects, the current spreading material may comprise current spreading dopant in an amount ranging from about $1 \times 10^{17}$ cm$^{-3}$ to about $5 \times 10^{20}$ cm$^{-3}$. In certain aspects, the current spreading material may have an electron mobility ranging from about 10 cm$^2$/V·s to about 1500 cm$^2$/V·s.

A drift region may be coupled to the drain 14, the substrate, or the current spreading layer 16, and disposed adjacent to the respective drain 14, substrate, or current spreading layer 16 in the vertical direction.

The drift region may comprise a drift region material. Example of suitable drift region materials include, but are not limited to, n− GaN, n− (Al,Ga,In)N, and the like.

In certain aspects, the drift region may have a thickness of at least about 500 nm. Depending on the range of power and associated voltage required for the application, the thickness can be between 10 nm-10 μm (corresponding approximately to 3V-3000V).

The drift region material may comprise a drift region dopant. In certain aspects, the drift region dopant may comprise silicon, oxygen, germanium, and the like. In certain aspects, the drift region material may comprise drift region dopant in an amount ranging from about $1 \times 10^{14}$ cm$^{-3}$ to about $5 \times 10^{17}$ cm$^{-3}$. In certain aspects, the drift region material may have an electron mobility ranging from about 100 cm$^2$/V·s to about 1500 cm$^2$/V·s.

The semiconductor structures 10, devices 12, or III-nitride vertical transistors 12 may comprise one or more functional bilayers 20. The one or more functional bilayers 20 may be produced by a method that does not involve regrowth. Without wishing to be bound by any particular theory, it is believed that a regrowth process produces a physical difference at an interface when compared with a process that does not involve regrowth. Implantation processes are believed to damage the crystal structure and contaminate interfaces with impurities such as silicon. Performing Secondary Ion Mass Spectroscopy (SIMS) on material at the interface or taking a Transmission Electron Microscopy (TEM) image of a cross-section of the interface would identify the difference between an interface that was produced from a regrowth process and an interface that was not produced from a regrowth process. A person having ordinary skill in the art would be able to distinguish between an interface that was produced from a regrowth process and an interface that was not produced from a regrowth process.

In certain aspects, the functional bilayer 20 may have a thickness ranging from about 2 nm to about 20 nm.

Referring to FIG. 2, in certain aspects, the functional bilayer 20 may comprise a barrier layer 26 and a 2 DEG-containing layer 28.

The barrier layer 26 may comprise a barrier material. The character of the barrier material may be impacted by the character of the materials immediately adjacent to the barrier material, in particular, the 2 DEG-containing material. In other words, a barrier material may exhibit current blocking properties under some conditions and may lack current blocking properties under other conditions. Examples of suitable barrier materials include, but are not limited to, AlGaN, (Al,In,Ga)N, and the like.

The barrier layer 26 may comprise a current blocking layer and an aperture region. The channel in the aperture region may be formed by the presence of a trench, the application of a gate voltage in excess of a threshold voltage, or a combination thereof. In certain aspects, the aperture region may have an electron density ranging from about $1 \times 10^{12}$ cm$^{-2}$ to about $2.5 \times 10^{13}$ cm$^{-2}$ when a gate voltage exceeds the threshold voltage. In certain aspects, the aperture region may have an electron mobility ranging from about 300 cm$^2$/V·s to about 2200 cm$^2$/V·s when a gate voltage exceeds the threshold voltage.

In certain aspects, the current blocking layer and aperture region are comprised of the same material. In preferred aspects, the current blocking layer and aperture region are formed by polarization engineering. In certain aspects, the current blocking layer and aperture region are not formed by doping or implantation. In preferred aspects, the current blocking layer and aperture region are not formed by a regrowth process.

In certain aspects, the barrier layer 26 may have a thickness ranging from about 1 nm to about 20 nm.

In certain aspects, the barrier layer 26 may have an electron density ranging from about $1 \times 10^{13}$ cm$^{-3}$ to about $1 \times 10^{17}$ cm$^{-3}$. In certain aspects, the barrier layer 26 may have an electron mobility ranging from about 10 cm$^2$/V·s to about 2000 cm$^2$/V·s.

Electrons may pass through the barrier layer 26 via tunneling.

In certain aspects, the 2 DEG-containing layer 28 may comprise a 2 DEG. The 2 DEG may have an electron density ranging from about $1 \times 10^{12}$ cm$^{-2}$ to about $2.5 \times 10^{13}$ cm$^{-2}$, or from about $5 \times 10^{12}$ cm$^{-2}$ to about $2 \times 10^{13}$ cm$^{-2}$. The 2 DEG may have an electron mobility ranging from about 300 cm$^2$/V·s to about 2200 cm$^2$/V·s.

The 2 DEG-containing layer 28 may comprise a 2 DEG-containing material. The character of the 2 DEG-containing material and corresponding 2 DEG may be impacted by the character of the materials immediately adjacent to the 2 DEG-containing material, in particular, the barrier material. In other words, a 2 DEG-containing material may contain a 2 DEG under some conditions and may lack a 2 DEG under other conditions. Examples of suitable 2 DEG-containing materials include, but are not limited to, GaN, (Al,In,Ga)N, and the like.

In certain aspects, the 2 DEG-containing layer 28 may have a thickness ranging from about 0.1 nm to about 10 nm. In certain aspects, the 2 DEG-containing layer 28 contains the 2 DEG, but is not comprised exclusively of the 2 DEG. In certain aspects, the 2 DEG-containing layer 28 consists of a material and a portion of that layer or material contains the 2 DEG.

In preferred aspects, the functional bilayer 20 may comprise a barrier layer 26 that is an AlGaN layer and a 2 DEG-containing layer 28 that is a GaN layer coupled to the AlGaN layer and disposed adjacent to the AlGaN layer along a vertical direction.

In certain aspects, the semiconductor structure 10, device 12, or III-nitride vertical transistor 12 may comprise one or more trenches. The trench or trenches may be formed by etching and may optionally be further processed to contain a gate 22 or SCFP. The trench or trenches may extend partially through the 2 DEG-containing layer 28, fully through the 2 DEG-containing layer 28, partially through the barrier layer 26, fully through the barrier layer 26, partially through the drift region, or a combination thereof. In certain aspects, the trench or trenches may have vertical side walls or tapering side walls.

The gate 22 may be positioned above or within the aperture region. In preferred aspects, the flow of electrons through the aperture may be modulated by the gate 22.

The gate 22 may comprise a gate material. In principle, any material that functions as a gate 22 is suitable for use in the present disclosure as a gate material. The gate material is preferably an electrical conductor. Examples of suitable gate materials include, but are not limited to, a metal (e.g., nickel, titanium, gold, copper, molybdenum, tungsten, tantalum, ruthenium, rhodium, palladium, platinum, etc.), a metal-containing compound (e.g., tantalum nitride, titanium nitride, etc.) polysilicon, polycrystalline silicon-germanium, and the like.

The gate 22 may have a portion within a trench having an aperture length ($L_{ap}$) and a portion outside of the trench and located above the functional bilayer 20 having a full gate length ($L_g$).

The gate 22 may be placed on top of the aperture and have an aperture length ranging from about 0.1 μm to about 30 μm. The gate 22 may have a full gate length ranging from about 0.1 μm to about 50 μm.

The source 24 may be coupled to the 2 DEG-containing layer 28. In preferred aspects, the source 24 may be coupled to the 2 DEG.

The source 24 may comprise a source material. In principle, any material that functions as a source 24 is suitable for use in the present disclosure as a source material. The source material is preferably an electrical conductor. Examples of suitable source materials include, but are not limited to, silicon-, oxygen-, or germanium-doped or implanted regions of (Al,Ga,In)N, and the like.

The device 12 or III-nitride vertical transistor 12 may further comprise a drain contact coupled to the drain 14, a gate contact coupled to the gate 22, a source contact coupled to the source 24, or a combination thereof.

The drain contact may comprise a drain contact material. The gate contact may comprise a gate contact material. The source contact may comprise a source contact material. The drain contact material, gate contact material, or source contact material is preferably an electrical conductor. Examples of suitable drain, gate, or source contact materials include, but are not limited to, a metal (e.g., nickel, titanium, gold, copper, molybdenum, tungsten, tantalum, ruthenium, rhodium, palladium, platinum, etc.), a metal-containing compound (e.g., tantalum nitride, titanium nitride, etc.) polysilicon, polycrystalline silicon-germanium, silicide regions as is known in the art, combinations thereof, and the like.

The devices 12 and III-nitride vertical transistors 12 of the present disclosure may comprise a dielectric layer 30 adapted and positioned to provide electrical insulation between one or more of the gate 22, the SCFP, and the TCE and one or more of the functional bilayer 20, the 2 DEG-containing layer 28, the barrier layer 26, and the drift layer 18.

In certain aspects, the device 12 or III-nitride vertical transistor 12 may be an enhancement mode (i.e., normally ON) or a depletion mode (i.e., normally OFF) device 12 or transistor 12.

There are 2 different modulation mechanisms that determine the normally-off or normally on operation of the device 12: 1) tunneling probability in the sidewall and the associated tunneling region overlapping the aperture region; and 2) the field-effect transport under the gate 22.

Normally off operation in these devices 12 can be ensured by appropriately choosing the layer thickness for the barrier layer 26 and 2 DEG-containing layer 28. For example, making the 2 DEG-containing layer 28 thinner (5 Å-2 nm) and the barrier layer 26 in the device 12 shown in FIG. 10 thicker (4 nm-15 nm). This will deplete the 2 DEG under the gate 22 below the threshold voltage (>0V). The device 12 will conduct when the gates 22 are biased above the threshold voltage.

Normally ON: if the density of available states is increased in the sidewall region and the associated aperture region to ensure high tunneling probability at 0 V or lower bias voltages applied to gate, conduction could be achieved like in a normally ON operation device.

The number of states along the sidewall of the trenched region and associated tunneling region overlapping the aperture region can be controlled by selective implantation and/or doping of the region, or by biasing the TCE at a bias voltage >0 (separate from the gate biases) to ensure there is available states to favor tunneling.

The III-nitride materials of the present disclosure may be N-polar. Without wishing to be bound by any particular theory, it is believed that a functional bilayer 20 consisting of an N-polar AlGaN layer and an N-polar GaN layer coupled to the N-polar AlGaN layer and disposed adjacent to the N-polar AlGaN layer in the vertical direction will provide a barrier layer 26 within or coextensive with the N-polar AlGaN layer and a 2 DEG within or coextensive with the N-polar GaN layer.

In certain aspects, the functional bilayer 20 may be grown in a single crystal growth process. In certain aspects, the drift layer 18 and functional bilayer 20 may be grown in a single crystal growth process. In certain aspects, the current spreading layer 16, drift layer 18, and functional bilayer 20 may be grown in a single crystal growth process. In preferred aspects, the drain 14, current spreading layer 16, drift layer 18, and functional bilayer 20 may be grown in a single crystal growth process.

The semiconductor structures 10, devices 12, and III-nitride vertical transistors 12 of the present disclosure may have a height in the vertical direction ranging from about 55 µm to about 2.0 mm. The semiconductor structures 10, devices 12, and III-nitride vertical transistors 12 of the present disclosure may have a length in a direction perpendicular to the vertical direction ranging from about 10.0 µm to about 100.0 µm. In certain aspects, the semiconductor structures 10, devices 12, and III-nitride vertical transistors 12 may be scaled to create a multiplexed system (for example, in a multiple finger geometry) having larger physical dimensions in a direction perpendicular to the vertical direction. In such aspects, the multiplexed system can have a length in a direction perpendicular to the vertical direction of up to about 10.0 mm.

The devices 12 and III-nitride vertical transistors 12 of the present disclosure may perform closer to an ideal switch than currently-available devices and transistors. In certain aspects, the devices 12 and III-nitride vertical transistors 12 may have a resistance in the OFF-state of at least 10 $\Omega/cm^2$ or at least about 1000 $\Omega/cm^2$. In certain aspects, the devices 12 and III-nitride vertical transistors 12 may have a resistance in the ON-state of at most about 10 m$\Omega/cm^2$ or at most about 10 $\Omega/cm^2$.

In certain aspects, the devices 12 and III-nitride vertical transistors 12 may have an On/Off current ratio ranging from about $10^2$ to about $10^{10}$.

The devices 12 and III-nitride vertical transistors 12 of the present disclosure may have improved breakdown voltage when compared with conventional devices and transistors.

The devices 12 and III-nitride vertical transistors 12 of the present disclosure may have improved leakage current. In certain aspects, the devices 12 and III-nitride vertical transistors 12 may have a current density of less than about 0.4 $A/cm^2$ when the device or transistor is biased in the OFF state.

A person having ordinary skill in the art should appreciate that a threshold voltage can be determined using techniques known in the art. The threshold voltage may vary based on the thickness and composition of the layers of the devices 12 or III-nitride vertical transistors 12. The devices 12 and III-nitride vertical transistors 12 of the present disclosure may have a threshold voltage ($V_t$) of at least about 0.001 mV.

The semiconductor structures 10, devices 12, and III-nitride vertical transistors 12 of the present disclosure may exhibit nondispersive transport properties. In certain aspects, the drain 14, current spreading layer 16, drift layer 18, functional bilayer 20, 2 DEG-containing layer 28, and barrier layer 26 may exhibit nondispersive transport properties.

This disclosure also provides methods of making a semiconductor structure 10, device 12, or III-nitride vertical transistor 12.

Figure 5A:
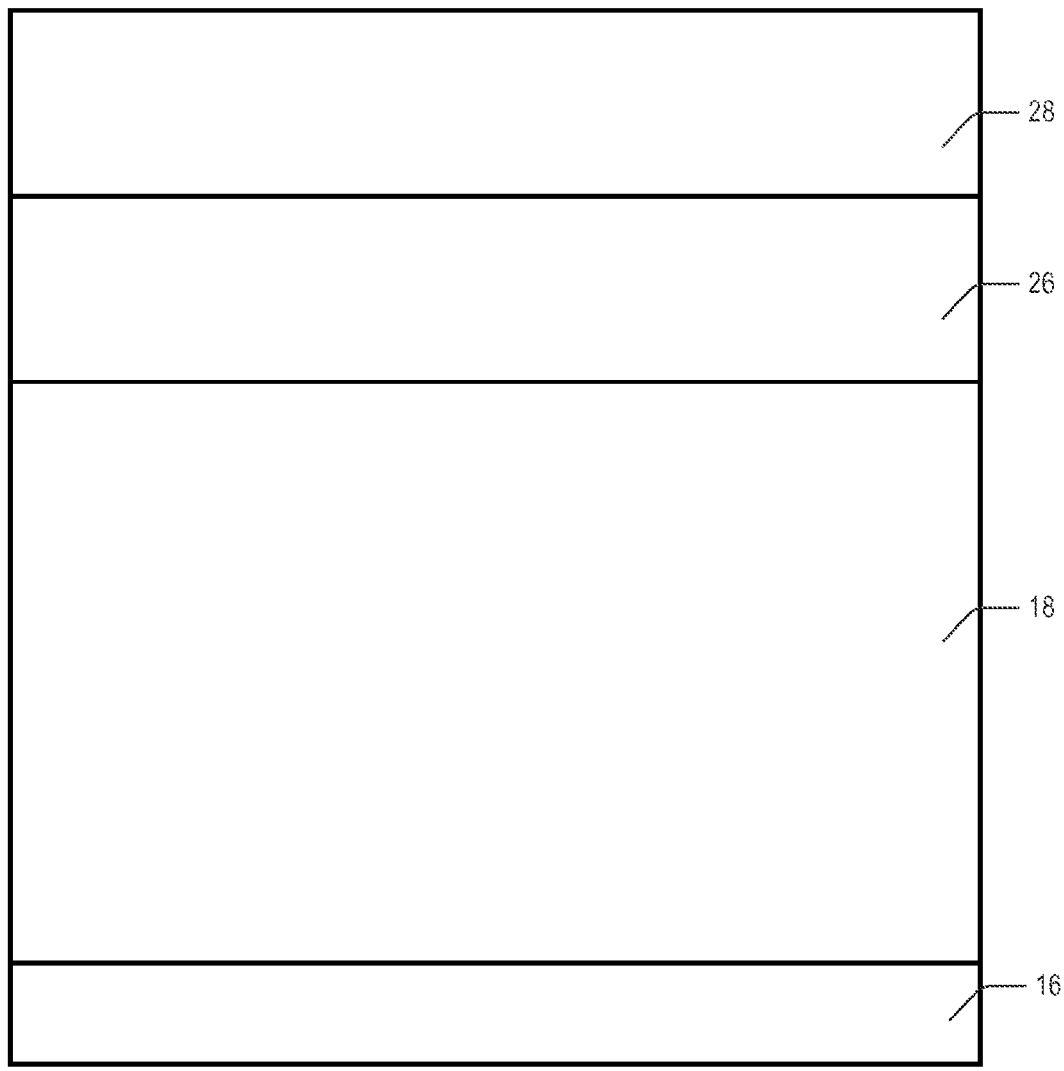
FIG. 5a is a schematic representation of one step of a method in accordance with one aspect of the present disclosure.
Figure 5B:
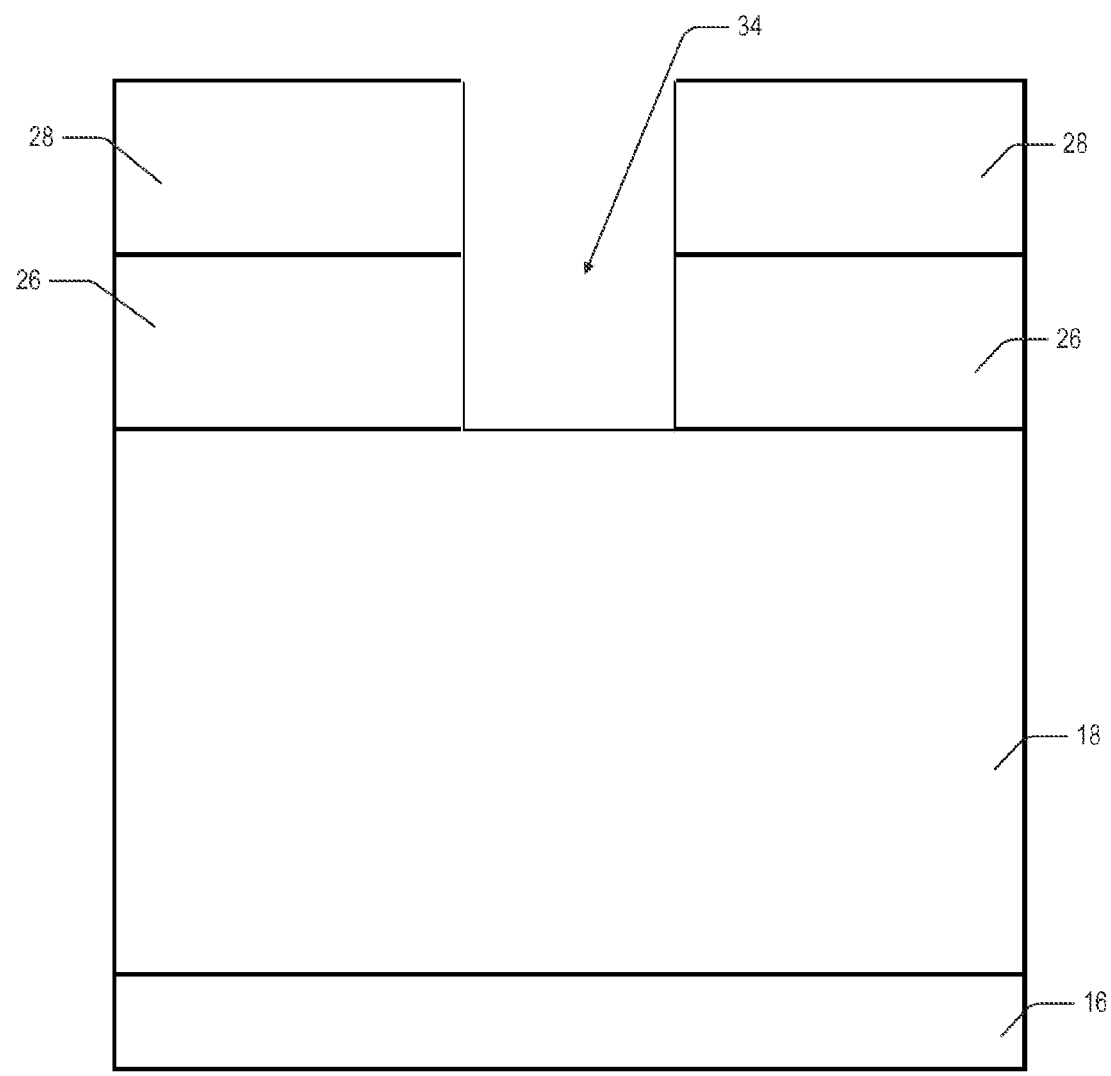
FIG. 5b is a schematic representation of one step of a method in accordance with one aspect of the present disclosure.
Figure 5C:
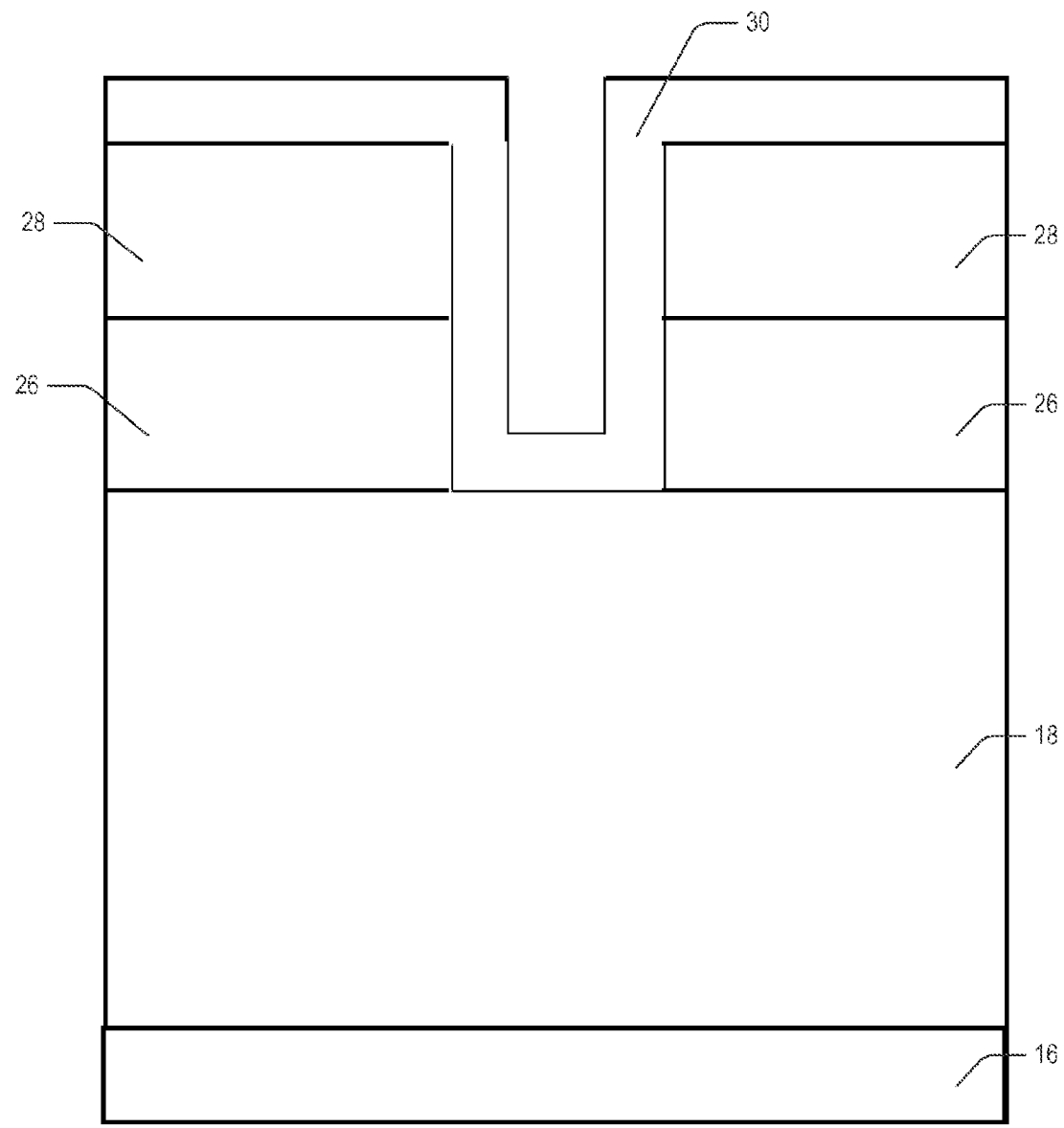
FIG. 5c is a schematic representation of one step of a method in accordance with one aspect of the present disclosure.
Figure 5D:
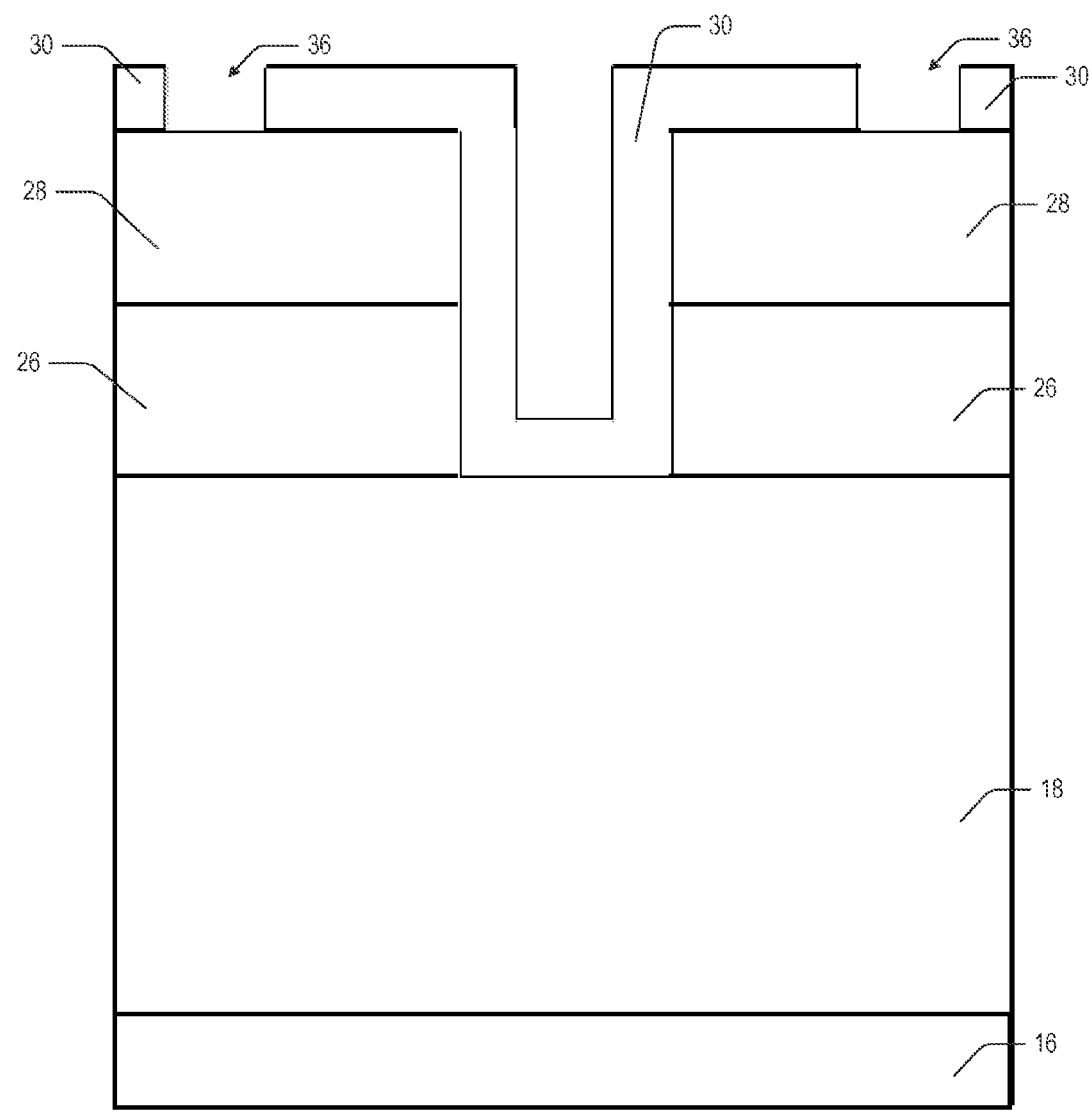
FIG. 5d is a schematic representation of one step of a method in accordance with one aspect of the present disclosure.
Figure 5E:
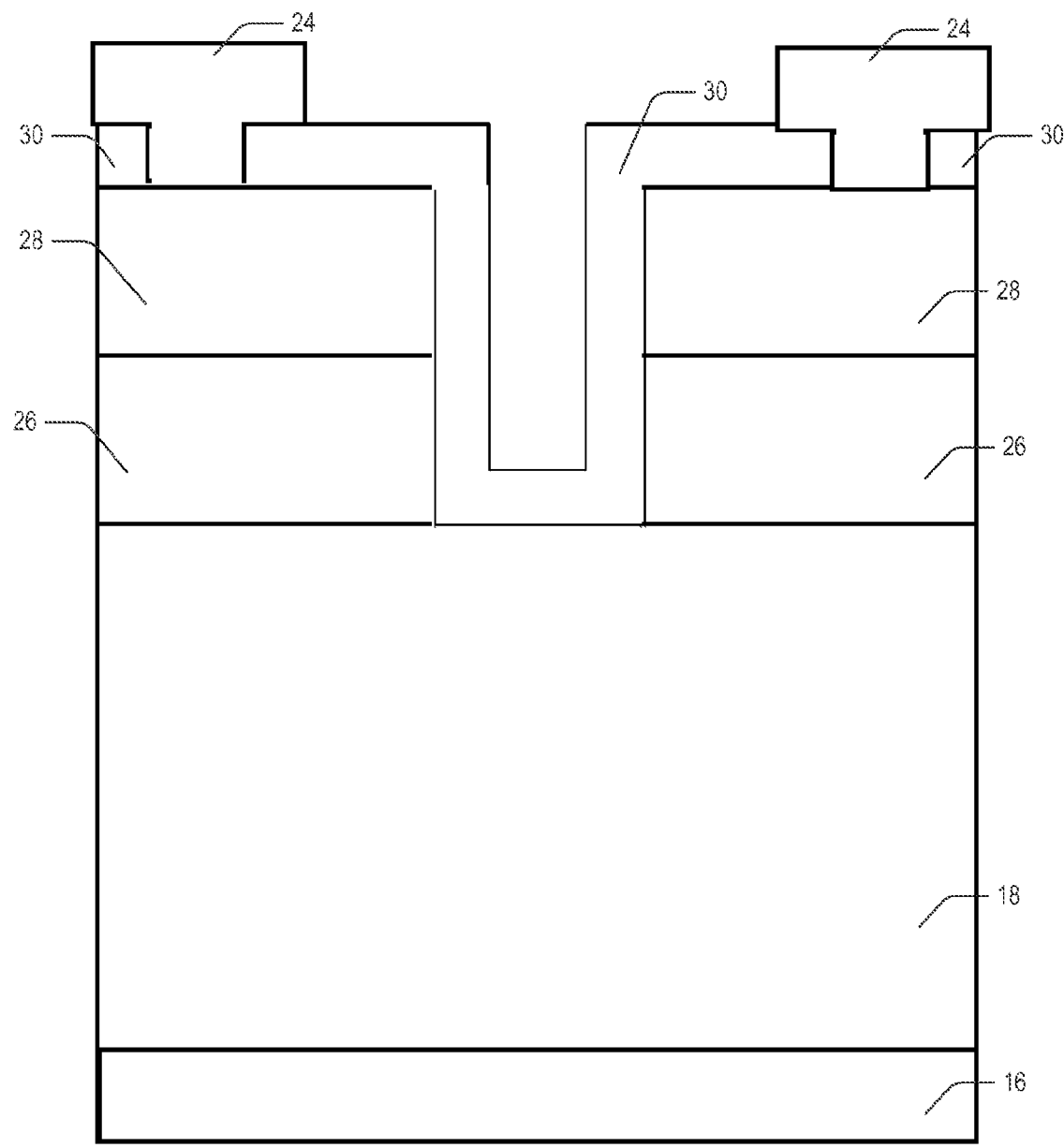
FIG. 5e is a schematic representation of one step of a method in accordance with one aspect of the present disclosure.
Figure 5F:
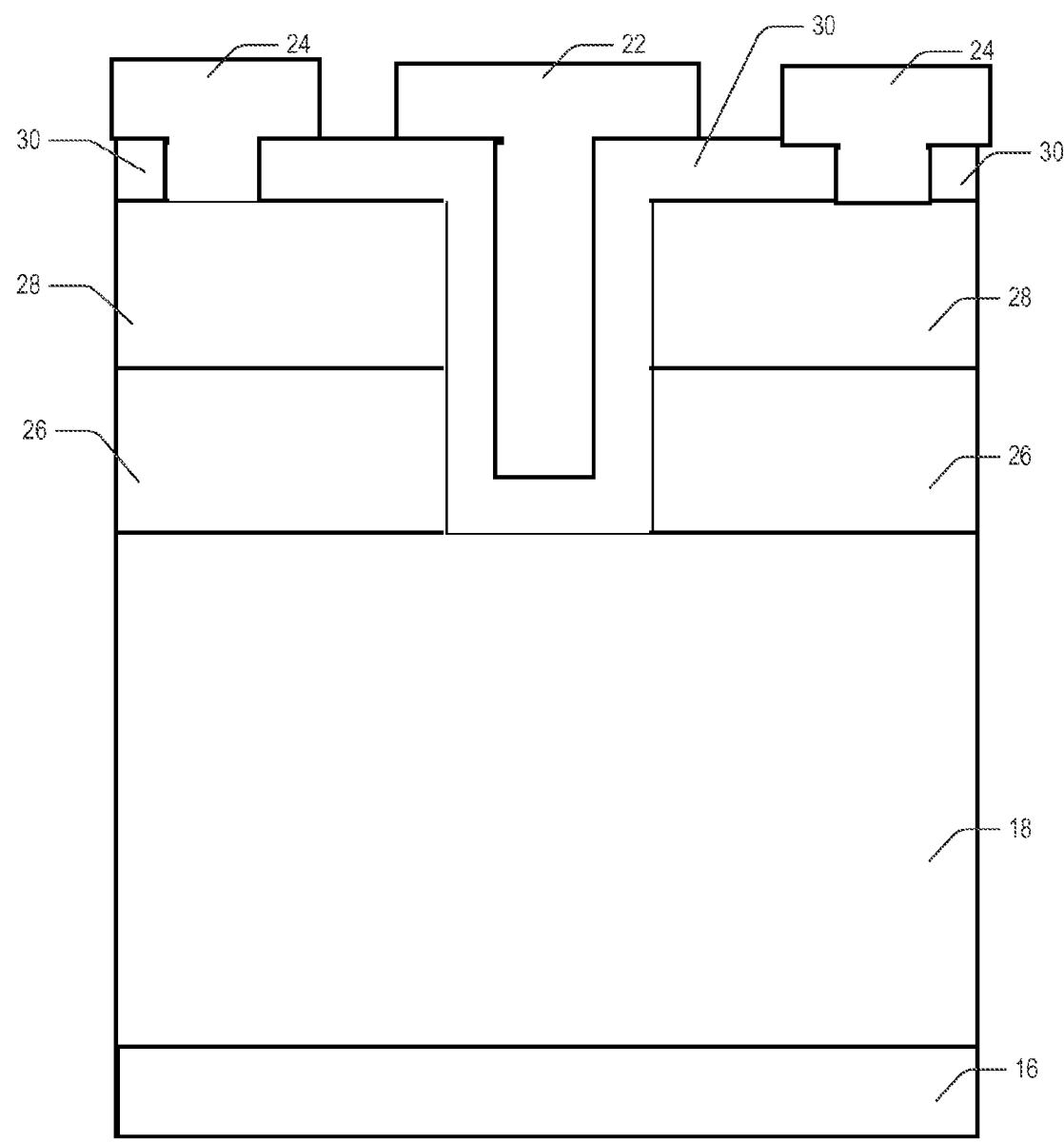
FIG. 5f is a schematic representation of one step of a method in accordance with one aspect of the present disclosure.
Figure 5G:
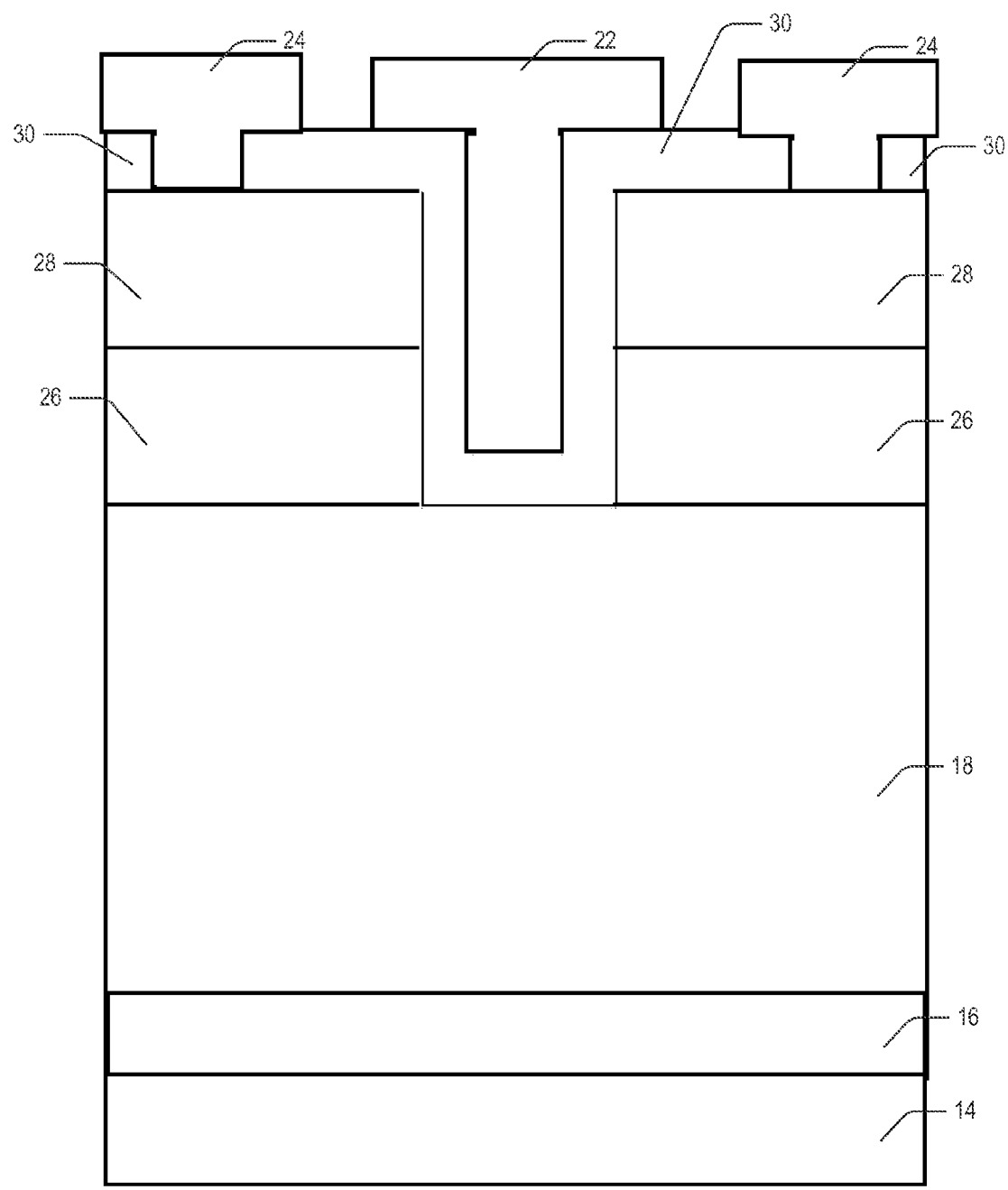
FIG. 5g is a schematic representation of one step of a method in accordance with one aspect of the present disclosure.

Referring to FIGS. 4 and 5a-5g, this disclosure provides a method 100 of making a device 12 or III-nitride vertical transistor 12. At process block 102, the method 100 can include providing an n-polar GaN substrate, such as the semiconductor structure 10 described herein. FIG. 5a is a schematic representation of the method 100 after process block 102. At process block 104, the method 100 can include removing a portion of the top two layers (i.e., the 2 DEG-containing layer 28 and the barrier layer 26) to form a gate region 34. FIG. 5b is a schematic representation of the method 100 after process block 104. At process block 106, the method 100 can include depositing a dielectric material within the gate region 34, and optionally atop the 2 DEG-containing layer 28 to form the dielectric layer 30. FIG. 5c is a schematic representation of the method 100 after process block 106. At process block 108, the method 100 can include removing two portions of the dielectric layer 30 to form source regions 36. FIG. 5d is a schematic representation of the method 100 after process block 108. At process block 110, the method 100 can include forming source electrodes 24 in the source regions 36 produced at process block 108. FIG. 5e is a schematic representation of the method 100 after process block 110. At process block 112, the method 100 can include forming a gate electrode 22 atop the dielectric material 30 in the gate region 34 formed at process blocks 104 and 106. FIG. 5f is a schematic representation of the method 100 after process block 112. At process block 114, the method 100 can include forming a drain electrode 14, optionally in ohmic contact with the current spreading layer 16. FIG. 5g is a schematic representation of the method 100 after process block 114.

The methods of the present disclosure may also include the following steps.

The methods may comprise obtaining, growing, or forming a substrate. The methods may comprise obtaining, growing, or forming a drain 14. In certain aspects, the methods may comprise growing or forming a drain 14 coupled to the substrate and disposed adjacent to the substrate in the vertical direction. In certain aspects, the methods may comprise growing or forming a substrate coupled to the drain 14 and disposed adjacent to the substrate in the vertical direction.

The methods may comprise obtaining, growing, or forming a current spreading layer 16. In aspects where the current spreading layer 16 is grown or formed, the methods may comprise growing or forming a current spreading layer 16 coupled to the drain 14 or substrate and disposed adjacent to the drain 14 or substrate in the vertical direction.

The methods may comprise obtaining, growing, or forming a drift layer 18. In aspects where the drift layer 18 is grown or formed, the methods may comprise growing or forming a drift layer 18 coupled to the current spreading layer 16 and disposed adjacent to the current spreading layer 16 in the vertical direction.

The methods may comprise obtaining, growing, or forming a functional bilayer 20. In aspects where the functional bilayer 20 is grown or formed, the methods may comprise growing or forming a functional bilayer 20 coupled to the drift layer 18 and disposed adjacent to the drift layer 18 in the vertical direction.

The methods may comprise obtaining, growing, or forming a barrier layer 26. In aspects where the barrier layer 26 is grown or formed, the methods may comprise growing or forming a barrier layer 26 coupled to the drift layer 18 and disposed adjacent to the drift layer 18 in the vertical direction.

The methods may comprise obtaining, growing, or forming a 2 DEG-containing layer 28. In aspects where the 2 DEG-containing layer 28 is grown or formed, the methods may comprise growing or forming a 2 DEG-containing layer 28 coupled to the barrier layer 26 and disposed adjacent to the barrier layer 26 in the vertical direction.

The methods may comprise forming a gate region 34 or trench. The purpose of the trench may be to contain a gate 22 or a SCFP. Forming the trench may comprise etching or other processes that produce the same result as etching. In certain aspects, the gate region 34 or trench extends throughout the 2 DEG-containing layer 28 and the barrier layer 26 to expose the drift layer 18.

The methods may comprise depositing a dielectric material to the interior of the trench, and optionally to the top surface of the functional bilayer 20.

The methods may comprise growing or forming a gate 22 or SCFP, optionally in the trench, and optionally on the top surface of the functional bilayer 20.

The methods may comprise growing or forming a source 24 coupled to the 2 DEG-containing layer 28, and optionally coupled to the 2 DEG. Forming the source 24 can be achieved by methods known to those having ordinary skill in the art. For example, a source metal can be deposited in the source regions 36, followed by an annealing step, for example, at about 900° C. for 30 seconds. As another example, Si implantation can be performed within the 2 DEG-containing layer 28 beneath the source regions 36, followed by deposition of source contacts atop the Si-implanted regions. As yet another example, the 2-DEG containing layer 28 can be etched beneath the source regions 36, and n+GaN can be regrown in the etched region, followed by deposition of source contacts atop the regrown n+GaN. It should be appreciated that the particular way that the source contacts are form is not intended to be limiting to the present disclosure, and any satisfactory process that forms the desired ohmic contact can be used.

Obtaining, growing or forming may comprise molecular beam epitaxy (MBE), chemical vapor deposition (CVD), metal organic CVD (MOCVD), hydride vapor pressure epitaxy (HVPE), or combinations thereof. Obtaining may further comprise simply acquiring the target of the obtaining step. An example of obtaining includes, but is not limited to, purchasing from a vendor.

In certain aspects, the method may not include a regrowth step. In certain aspects, the method may include regrowth steps in the forming of ohmic contact, but otherwise may not include a regrowth step. In certain aspects, the obtaining, growing, or forming a barrier layer may not include a regrowth step.

This disclosure also provides uses of the semiconductor structures 10, devices 12, and III-nitride vertical transistors 12 described herein. Examples of uses include, but are not limited to, use as a switch in an electronic application, in particular, in medium- and high-power (including, but not limited to 10 W-100 kW) electronic applications, in DC to DC, DC to AC, AC to DC, and AC to AC power converters, and the like. It should be appreciated that the semiconductor structures 10, devices 12, and III-nitride vertical transistors 12 of this disclosure are also suitable for low-power electronic applications, such as use in an S-band device, a radio-frequency device, or a combination thereof.

The present disclosure includes an active buried current blocking layer and aperture that can be grown in situ and formed by polarization manipulation without the need of a regrowth process. This represents a significant improvement over the prior art.

The present disclosure can be further understood by way of the following non-limiting examples.

EXAMPLES

Example 1. Enhancement Mode, Low $R_{ON}$ III-Nitride Vertical Transistor

A computer simulation was performed to simulate the performance of a GaN-based enhancement mode (i.e., normally off), low $R_{ON}$ N-polar vertical device as shown in FIG. 2, produced with a regrowth free fabrication technique. The device consists of a high-electron density ($\sim 1 \times 10^{13}/cm^2$), high mobility (1500 $cm^2/V \cdot s$) channel in the access region extending from the source to the gate sitting on a 3 nm-thick SiN. The SiN was deposited in situ on 2 nm-thick GaN. The GaN was deposited in situ on top of 4 nm-thick $Al_{0.3}Ga_{0.7}N$. The electrons were shown to tunnel from the source into region B and flow through the drift region into the drain. The region B was formed by etching away the GaN and the AlGaN layers from the top. The gate material in the region B sits on a dielectric layer, comprised of SiN, and thereby forms the normally-off part of the channel. A person having ordinary skill in the art should appreciate that the functionality of this device was achieved by polarization engineering and not by way of doping or implantation. As a result, the fabrication of this device can be achieved in a single growth process, which maintains the as-grown material quality throughout the fabrication process. The breakdown field in these devices is expected to be close to the theoretical predicted values since the material quality in the CBL was not compromised.

Figure 6A:
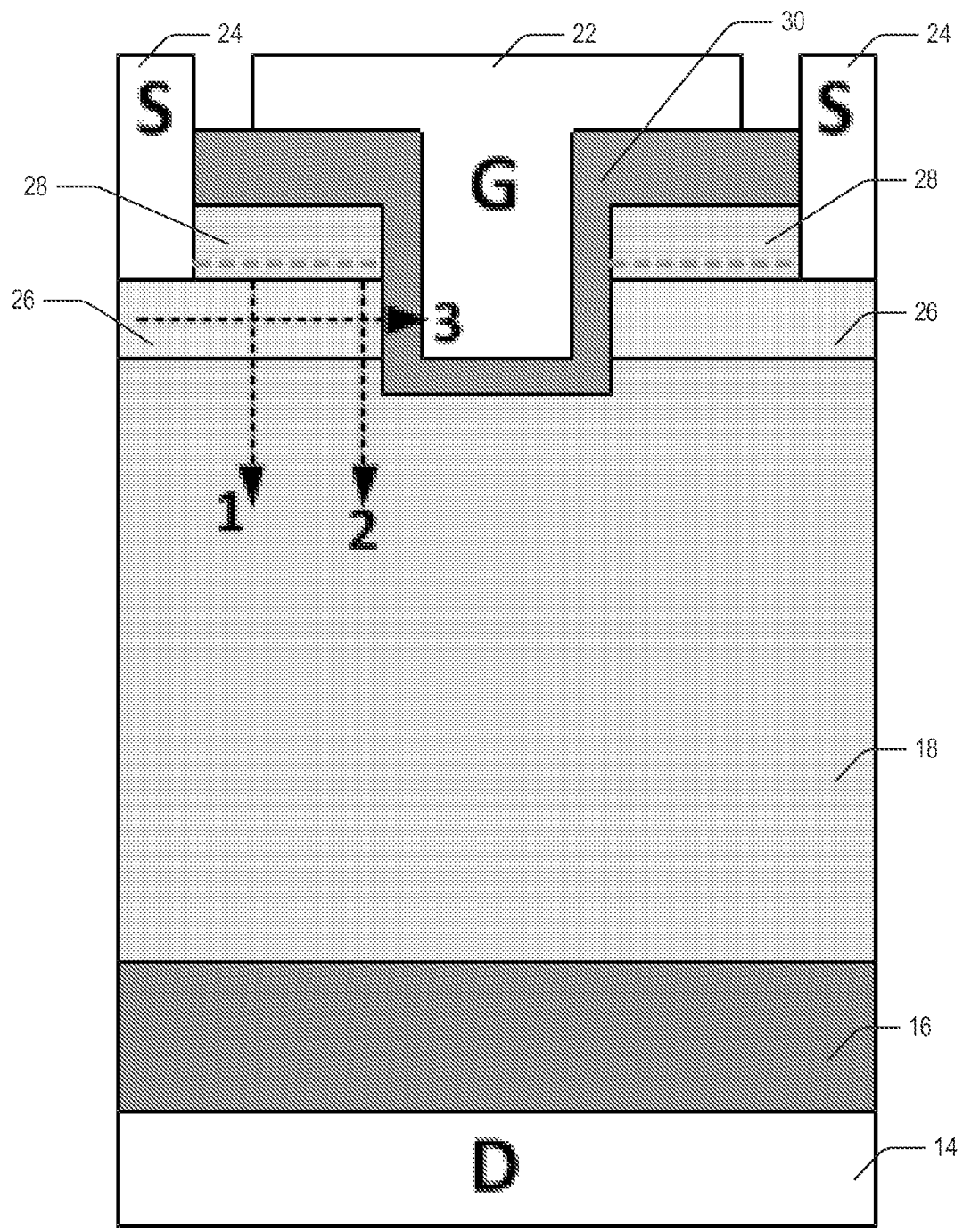
FIG. 6a is a schematic of a vertical transistor according to one aspect of the disclosure.
Figure 6B:
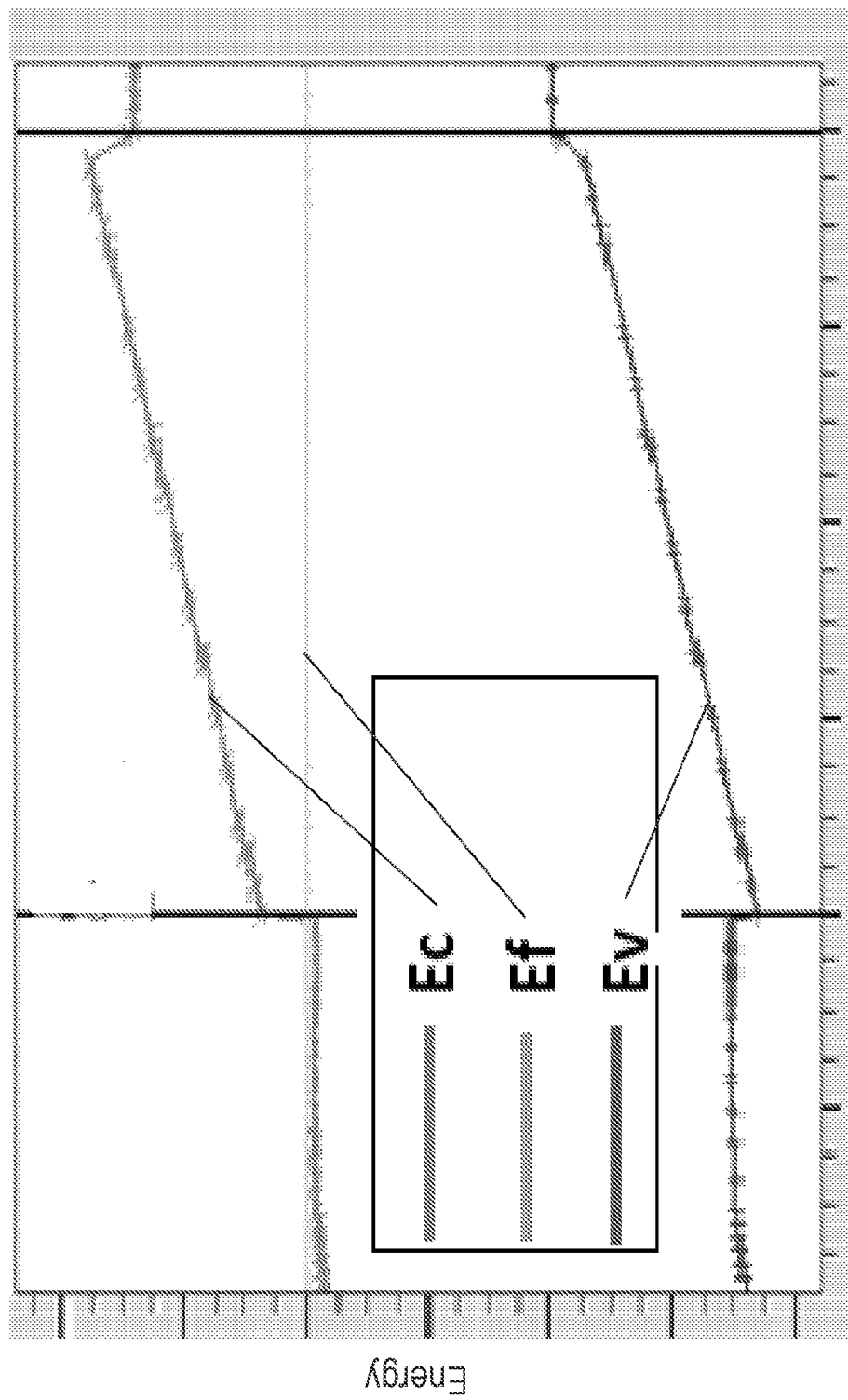
FIG. 6b is an energy band diagram of the vertical transistor of FIG. 6a with a gate bias of 5 V showing a current pathway that is unavailable due to a high barrier (route 1).
Figure 6C:
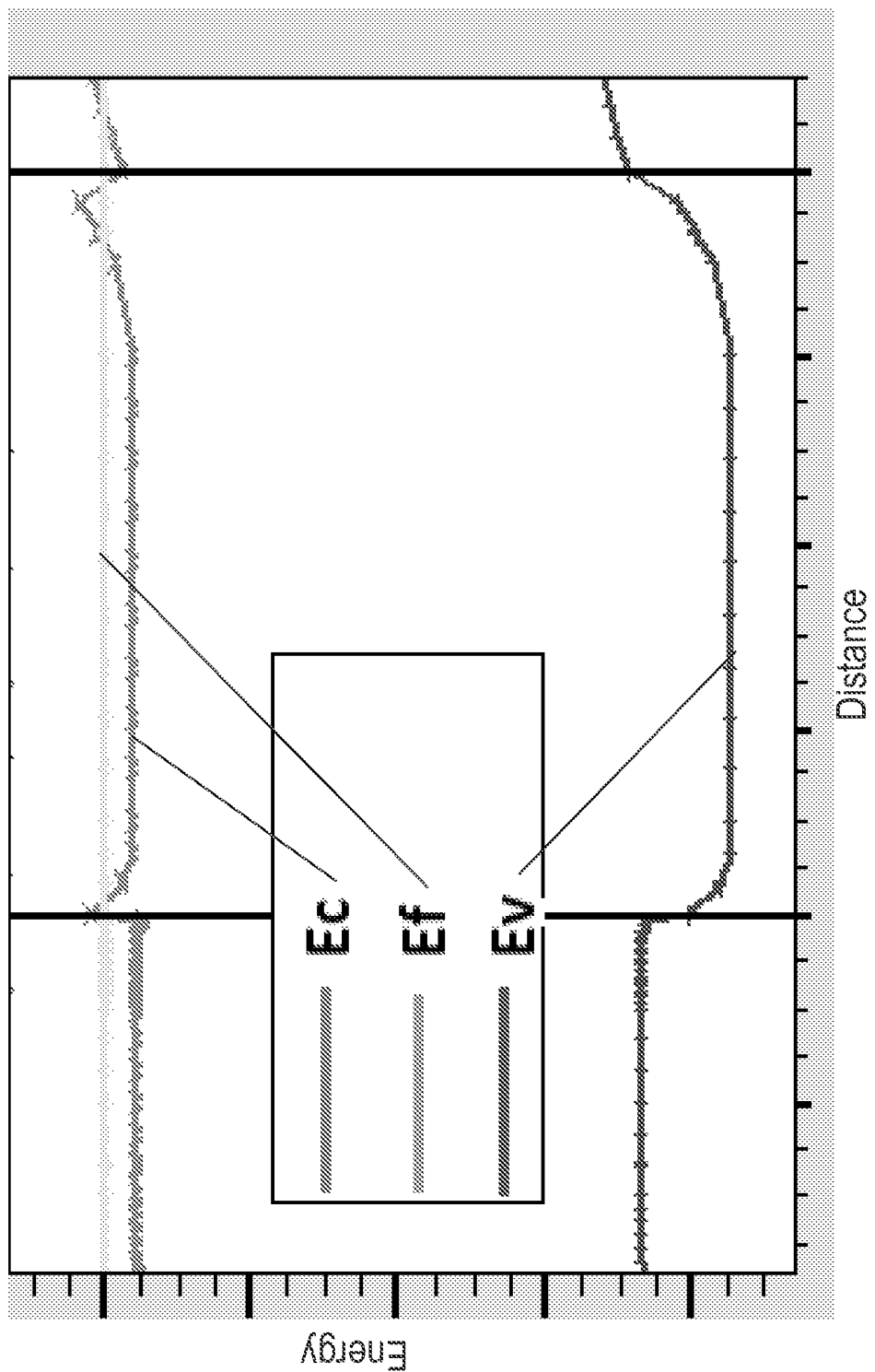
FIG. 6c is an energy band diagram of the vertical transistor of FIG. 6a with a gate bias of 5 V showing a current pathway that is available due to a field effect (route 2).
Figure 6D:
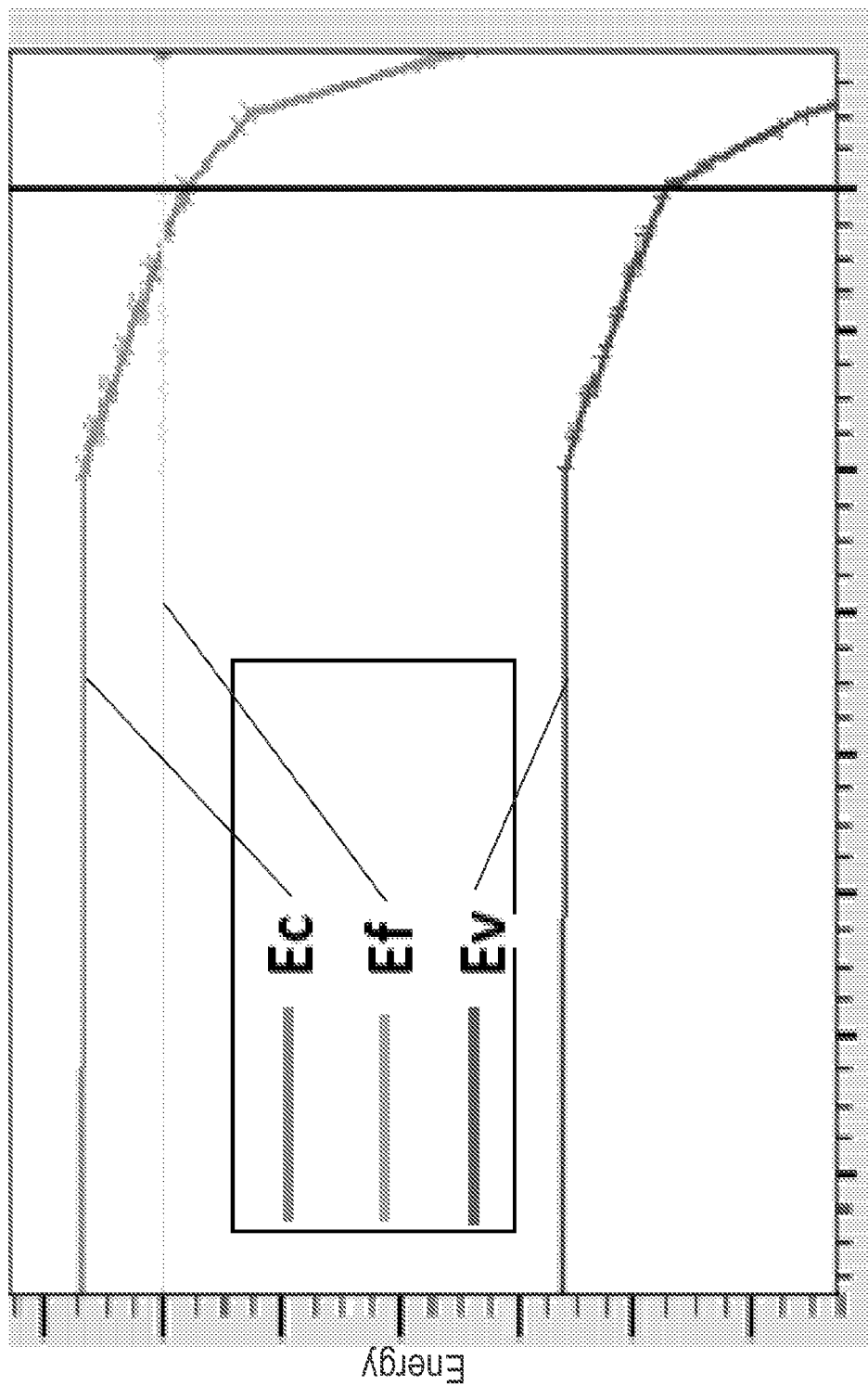
FIG. 6d is an energy band diagram of the vertical transistor of FIG. 6a with a gate bias of 5 V showing the energy band bending that is induced by a gate bias (route 3).

FIG. 6a shows a schematic of the device, with three routes identified. The energy band diagrams of the three routes are shown in FIGS. 3b, 3c, and 3d for a gate bias of 5 V. The x-axis is the distance along the respective route and the y-axis is the energy. The energy band diagram of route 1 (FIG. 6b) shows that a barrier exists at route 1, and therefore current will not flow along that path. The energy band diagram of route 2 (FIG. 6c) shows that a tunneling path is available at route 2, and therefore current could flow along that path. The energy band diagram of route 3 (FIG. 6d) shows that the gate bias induces energy band bending, which contributes to the presence of the tunneling path at route 2. The 2 DEG density of this configuration can be as high as $4 \times 10^{13}$ cm$^{2}$.

The energy band diagrams of routes 1 and 2 of FIG. 6a with a gate bias of 0 V are shown in FIGS. 7a and 7b, respectively. The x-axis is the distance along the respective route and the y-axis is the energy. The energy band diagrams of routes 1 and 2 show that a barrier exists at routes 1 and 2, and therefore current is inhibited from flowing along those paths. The 2 DEG density of this configuration was approximately $7.5 \times 10^{11}$ cm$^{2}$.

Figure 8A:
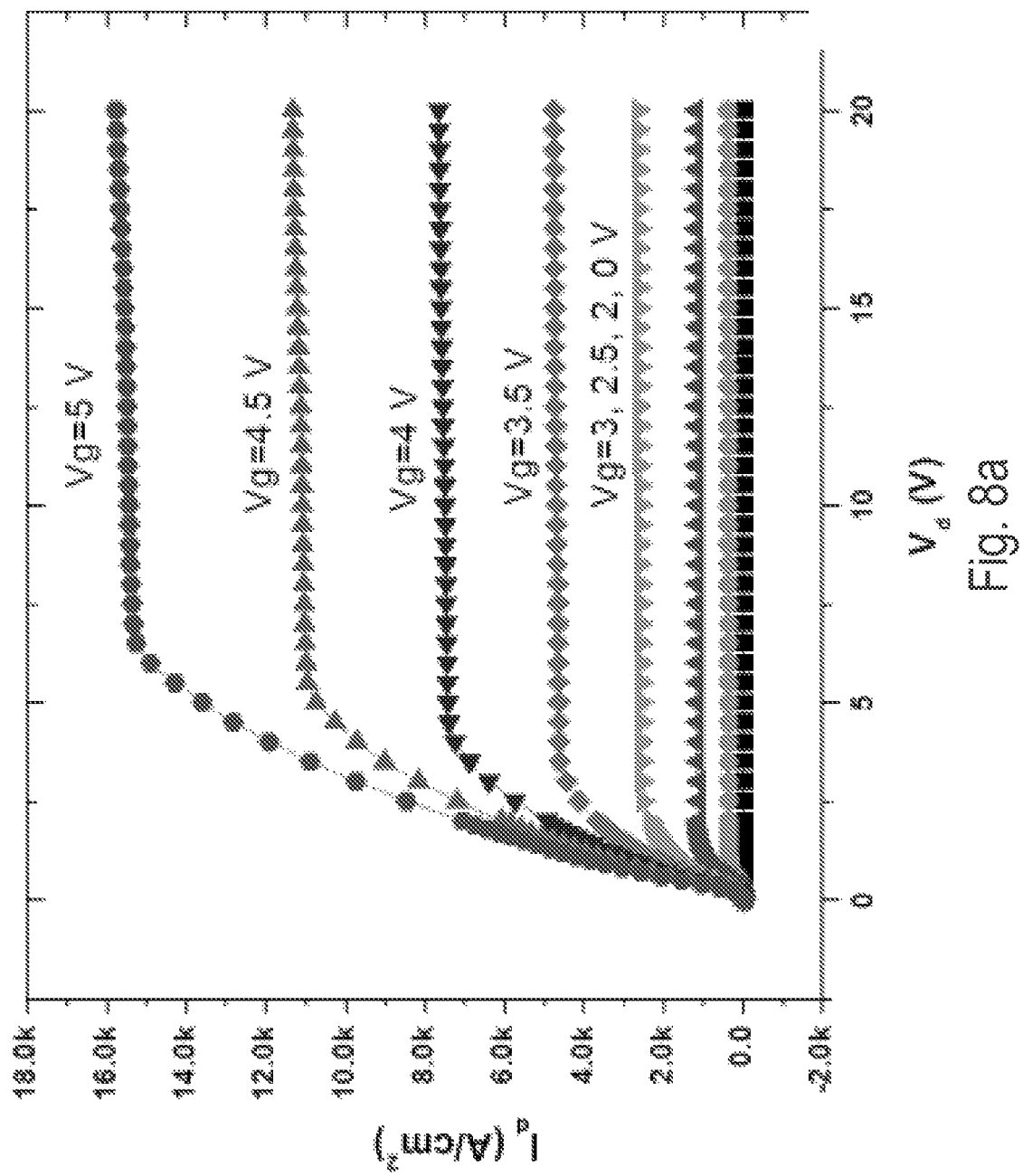
FIG. 8a shows a plot of the output $I_d$-$V_d$ curves for the transistor of Example 1 at varying gate voltages at a first zoom level
Figure 8B:
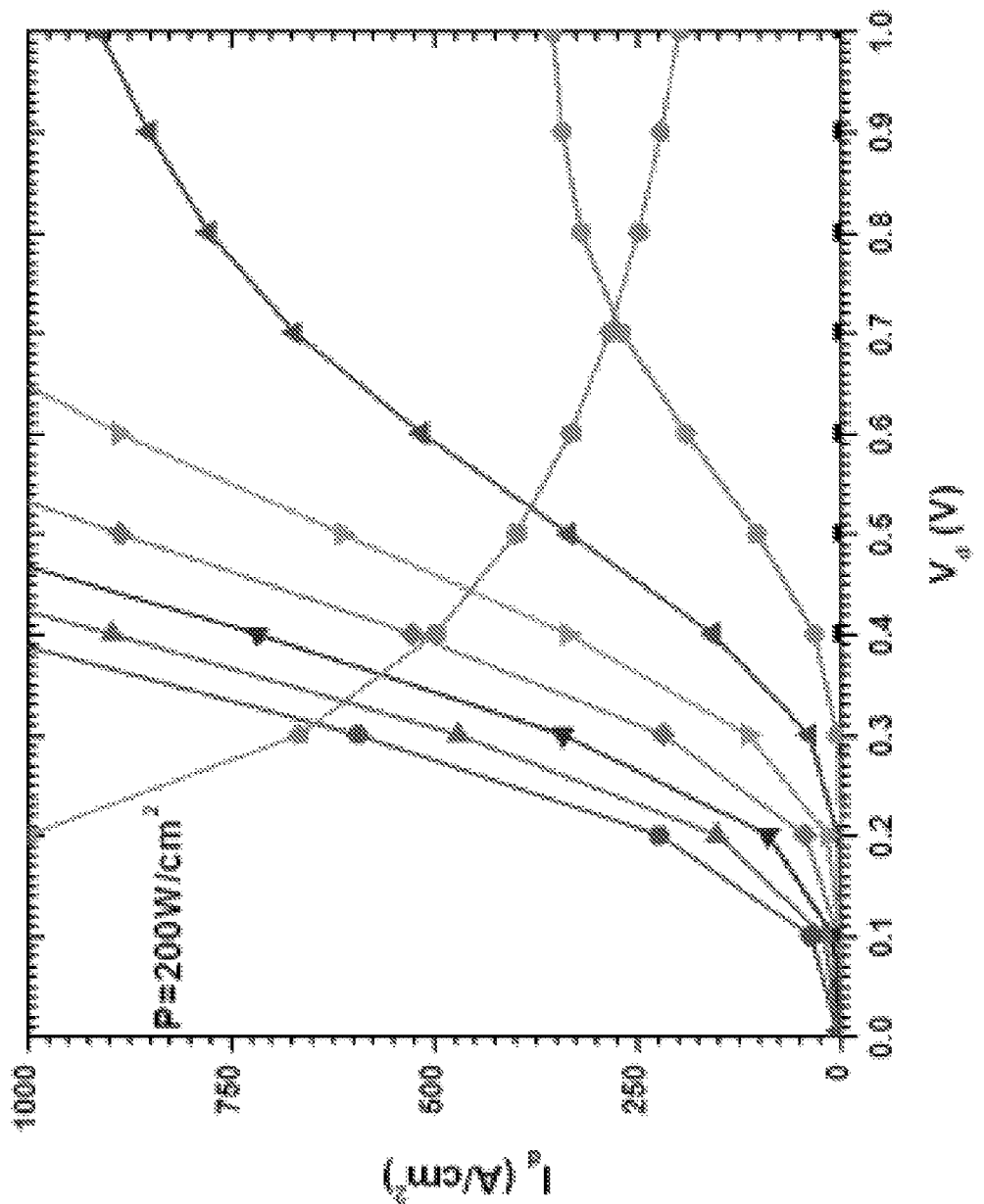
FIG. 8b shows a plot of the output $I_d$-$V_d$ curves for the transistor of Example 1 at varying gate voltages at a second zoom level.

FIGS. 8a and 8b are plots of the $I_d$-$V_d$ curve for the device at varying gate voltages. The plot in FIG. 8a is a zoomed-out view and shows that increasing gate voltages increases the maximum current. The plot in FIG. 8b is a zoomed in view and shows that the device exhibits diode-like behavior, which based on the understanding that transistors typically exhibit linear behavior, serves as evidence that tunneling is taking place.

Figure 9:
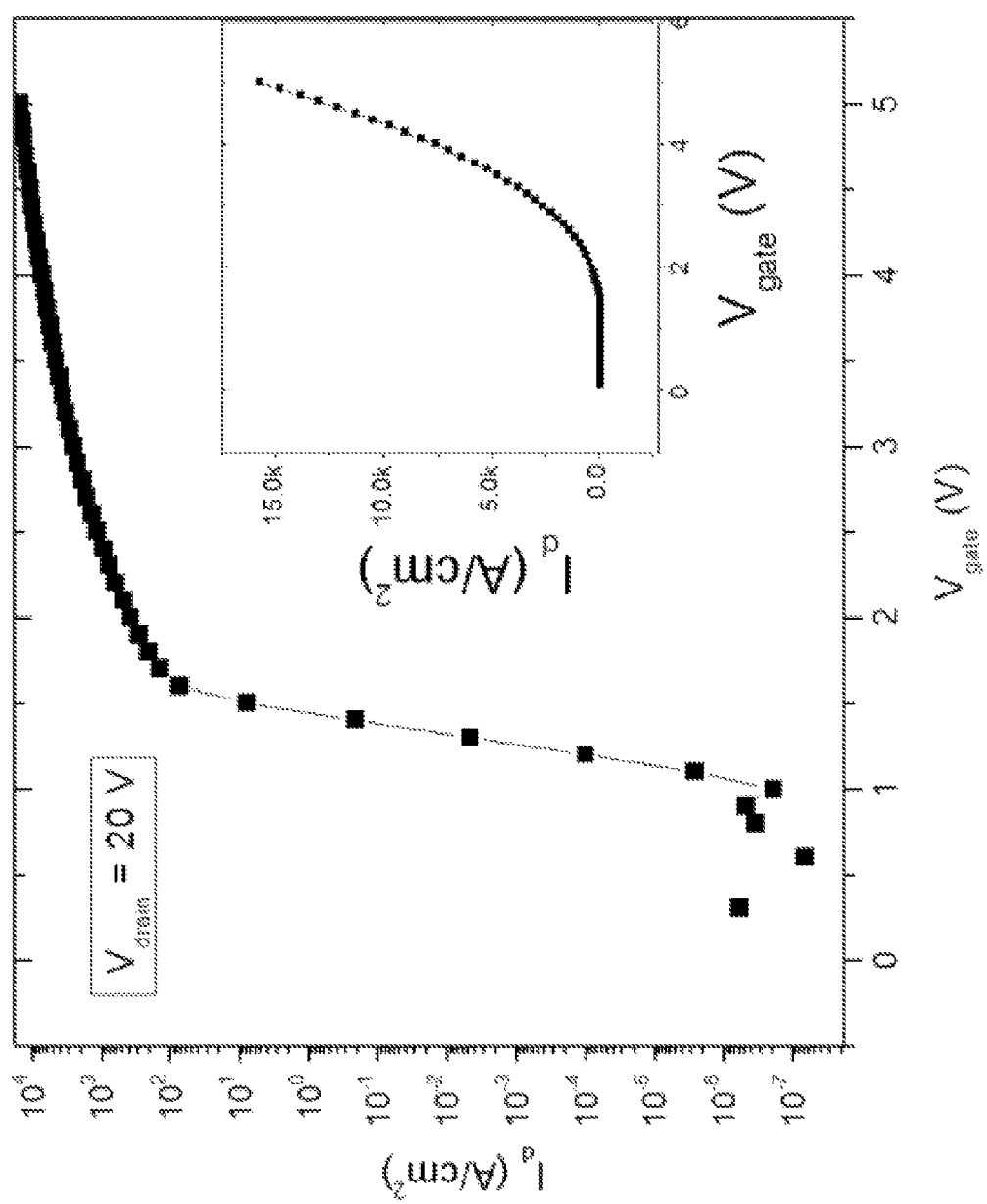
FIG. 9 is a plot of the $I_d$-$V_g$ curve for the transistor of Example 1 on a logarithmic scale (main) and linear scale (inset).

FIG. 9 is a plot of the $I_d$-$V_g$ curve for the device on a logarithmic scale (main) and linear scale (inset). The plot shows that the threshold voltage ($V_t$) is greater than about 1 V and the current that passes in the OFF state is on the order of $10^{-6}$ A/cm$^2$.

Example 2. A Two-Channel Depletion Mode III-Nitride Vertical Transistor

A computer simulation was performed to simulate the performance of a two-channel depletion mode (i.e., normally on) device shown in FIG. 10 (right) with the semiconductor structure shown in FIG. 10 (left). This device consists of a high electron density (~$1.8 \times 10^{13}$/cm$^2$), high mobility (~1500 cm$^2$/V·s) channel in the access region extending from the source, where the electrons tunnel into the second channel under the secondary electrode, which is embodied by a source connected field plate (SCFP). The channel under the SCFP is formed by appropriately etching away the top channel region and the electron depleting top AlGaN layer, and then depositing a dielectric layer, such as SiN. The planar gates flank the aperture on both sides with a gate length of $L_{GO}$ as shown in FIG. 10. In the ON-state of operation, the gate bias maximizes the conductance of the region beneath the gate. Electrons flow from the source through the access region and under the gates ($L_{GO}$). The electrons then tunnel into the second channel under the SCFP. The SCFP also provides a surface for termination of the electric field emanating from the channel and drift region below. The electrons tunnel through the thin AlGaN back barrier and subsequently flow into the drift region leading to the drain.

Figure 11:
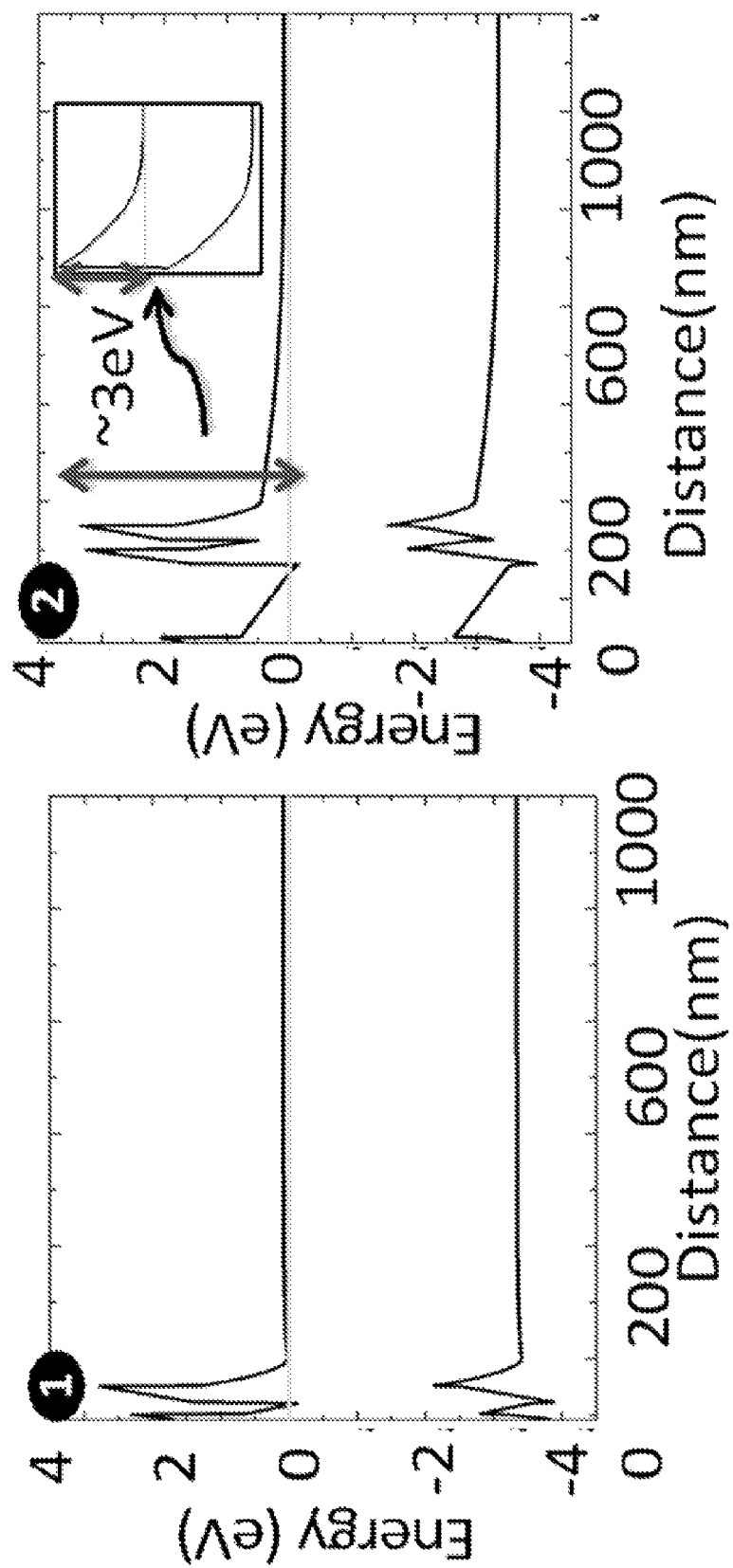
FIG. 11 is a plot of the energy band diagram along the cross-sections identified in FIG. 10.

FIG. 11 shows the energy band diagrams for cross-section 1 (left) and cross-section 2 (right) of FIG. 10.

A person having ordinary skill in the art should appreciate that the functionality of this device was achieved by polarization engineering and not by way of doping or implantation. As a result, the fabrication of this device can be achieved in a single growth process, which maintains the as-grown material quality throughout the fabrication process. The breakdown field in these devices is expected to be close to the theoretical predicted values since the material quality was not compromised and the CBL was formed of a high quality, wider bandgap AlGaN material.

The invention claimed is:

1. A semiconductor device comprising:
    a drain;
    a barrier layer disposed on a first side of the drain and in electronic communication with the drain, the barrier layer comprising a current blocking layer and an aperture region;
    a two-dimensional electron gas-containing layer disposed on the first side relative to the barrier layer;
    a gate electrode oriented to alter the energy levels of the aperture region when a gate voltage is applied to the gate electrode; and
    a source in ohmic contact with the two-dimensional electron gas-containing layer,
    wherein the current blocking layer and aperture region are formed by polarization engineering and not doping or implantation, and the device has a resistance in an OFF-state of at least about 1000 Ω·cm$^2$.

2. The semiconductor device of claim 1, the two-dimensional electron gas-containing layer comprising a two-dimensional electron gas, wherein the two-dimensional electron gas has an electron density of about $1 \times 10^{12}$ cm$^{-2}$ to about $2.5 \times 10^{13}$ cm$^{-2}$.

3. The semiconductor device of claim 1, wherein the aperture region has an electron mobility of about 300 cm$^2$/V·s to about 2200 cm$^2$/V·s when the gate voltage applied to the gate electrode exceeds a threshold voltage.

4. The semiconductor device of claim 1, wherein the barrier layer has a thickness of about 1 nm to about 20 nm.

5. The semiconductor device of claim 1, wherein the current blocking layer and aperture region are comprised of the same material.

6. The semiconductor device of claim 1, further comprising a current spreading layer and a drift layer disposed between the drain and the barrier layer, the drift layer disposed on the first side relative to the current spreading layer.

7. The semiconductor device of claim 1, wherein the semiconductor device is a depletion mode device.

8. The semiconductor device of claim 1, wherein the semiconductor device is an enhancement mode device.

9. The semiconductor device of claim 1, wherein the barrier layer comprises AlGaN, (Al,In,Ga)N, or a combination thereof.

10. The semiconductor device of claim 1, wherein the two-dimensional electron gas-containing layer comprises GaN, (Al,In,Ga)N, or a combination thereof.

11. The semiconductor device of claim 1, wherein the device has a resistance in the ON-state of at most about 10 mΩ·cm².

12. The semiconductor device of claim 1, wherein the device has an On/Off current ratio of $10^2$ to $10^{10}$.

13. The semiconductor device of claim 1, wherein the device has a current density of less than about 0.4 A/cm² in an OFF state.

14. The semiconductor device of claim 1, further comprising a substrate in contact with the drain.

15. A method of making a semiconductor device, the method comprising:
   obtaining, growing, or forming a N-polar GaN substrate comprising a functional bilayer comprising a barrier layer and a two-dimensional electron gas-containing layer disposed on a first side of the barrier layer;
   removing a portion of the functional bilayer to form a gate region;
   depositing a dielectric material in the gate region and atop the two-dimensional electron gas-containing layer on the first side relative to the two-dimensional electron gas-containing layer;
   removing two portions of the dielectric material atop the two-dimensional electron gas-containing layer to form source regions;
   forming source electrodes in ohmic contact with the two-dimensional electron gas-containing layer in the source regions;
   forming a gate electrode atop the dielectric material in the gate region; and
   forming a drain disposed on a second side opposite the first side of the functional bilayer,
   wherein the method is performed without a regrowth step.

16. The method of claim 15, wherein the N-polar GaN substrate includes a drift layer disposed on the second side relative to the barrier layer and a current spreading layer disposed on the second side relative to the drift layer, wherein the drain is disposed on the second side relative to the current spreading layer.

17. The method of claim 15, the method comprising growing the N-polar GaN substrate is grown in a single crystal growth process.

18. The method of claim 15, wherein the gate region extends throughout the two-dimensional gas-containing layer and the barrier layer.

19. A method of making a semiconductor device, the method comprising:
   obtaining, growing, or forming a N-polar GaN substrate comprising functional bilayer comprising a barrier layer and a two-dimensional electron gas-containing layer disposed on a first side of the barrier layer;
   forming a source electrode in ohmic contact with the two-dimensional electron gas-containing layer;
   forming a gate electrode oriented to provide alter the energy levels of the barrier layer to form an aperture region when a gate voltage is applied exceeding a threshold voltage; and
   forming a drain disposed on a second side of the barrier layer, the second side opposite the first side,
   wherein the method is performed without a regrowth step.

* * * * *

UNITED STATES PATENT AND TRADEMARK OFFICE
CERTIFICATE OF CORRECTION

PATENT NO. : 9,893,174 B2
APPLICATION NO. : 15/312894
DATED : February 13, 2018
INVENTOR(S) : Srabanti Chowdhury et al.

It is certified that error appears in the above-identified patent and that said Letters Patent is hereby corrected as shown below:

In the Specification

Column 5, Line 24, "µl-nitride" should be --III-nitride--.

Signed and Sealed this
Twenty-fourth Day of April, 2018

Andrei Iancu
*Director of the United States Patent and Trademark Office*